(12) United States Patent
Thompson et al.

(10) Patent No.: US 7,927,658 B2
(45) Date of Patent: Apr. 19, 2011

(54) DEPOSITION PROCESSES USING GROUP 8 (VIII) METALLOCENE PRECURSORS

(75) Inventors: David M. Thompson, Williamsville, NY (US); Cynthia A. Hoover, Grand, NY (US); John D. Peck, West Seneca, NY (US); Michael M. Litwin, Cheektowaga, NY (US)

(73) Assignee: Praxair Technology, Inc., Danbury, CT (US)

( * ) Notice: Subject to any disclaimer, the term of this patent is extended or adjusted under 35 U.S.C. 154(b) by 1683 days.

(21) Appl. No.: 10/685,785

(22) Filed: Oct. 16, 2003

(65) Prior Publication Data

US 2004/0126485 A1    Jul. 1, 2004

Related U.S. Application Data

(60) Provisional application No. 60/422,946, filed on Oct. 31, 2002, provisional application No. 60/422,947, filed on Oct. 31, 2002, provisional application No. 60/426,284, filed on Nov. 14, 2002, provisional application No. 60/427,461, filed on Nov. 18, 2002, provisional application No. 60/446,320, filed on Feb. 7, 2003, provisional application No. 60/453,718, filed on Apr. 18, 2003, provisional application No. 60/453,719, filed on Apr. 18, 2003, provisional application No. 60/453,717, filed on Apr. 18, 2003.

(51) Int. Cl.
    C23C 16/06     (2006.01)

(52) U.S. Cl. .................................................. 427/248.1

(58) Field of Classification Search ............... 427/248.1, 427/587, 593, 255.3, 250
See application file for complete search history.

(56) References Cited

U.S. PATENT DOCUMENTS 4,970,093 A * 11/1990 Sievers et al. ................. 427/575
(Continued)

FOREIGN PATENT DOCUMENTS

JP      11025589 A    1/1999
(Continued)

OTHER PUBLICATIONS

Peck et al., "Chemical Vapor Deposition Of Novel Precursors For Advanced Capacitor Electrodes", *Electrochemical Society, Inc.* published and presented on May 14, 2002.

*Primary Examiner* — Timothy H Meeks
*Assistant Examiner* — Elizabeth Burkhart
(74) *Attorney, Agent, or Firm* — Iurie A. Schwartz; Nilay S. Dalal

(57) ABSTRACT

Disclosed herein is a process for producing a film, coating or powder employing a metallocene or metallocene-like precursor having the general formula CpMCp', where M is a metal selected from the group consisting of Ru, Os and Fe; Cp is a first substituted cyclopentadienyl or cyclopentadienyl-like, e.g., indenyl, moiety that includes at least one substituent group $D_1$, where $D_1$ is X; $C_{a1}H_{b1}X_{c1}$; $C_{a2}H_{b2}X_{c2}(C=O)$ $C_{a1}H_{b1}X_{c1}$; $C_{a2}H_{b2}X_{c2}OC_{a1}H_{b1}X_{c1}$; $C_{a2}H_{b2}X_{c2}(C=O)$ $OC_{a1}H_{b1}X_{c1}$; or $C_{a2}H_{b2}X_{c2}O(C=O)C_{a1}H_{b1}X_{c1}$; and Cp' is a second substituted cyclopentadienyl or cyclopentadienyl-like, e.g., indenyl, moiety that includes at least one substituent group $D_1'$, where $D1'$ is X; $C_{a1}H_{b1}X_{c1}$; $C_{a2}H_{b2}X_{c2}(C=O)$ $C_{a1}H_{b1}X_{c1}$; $C_{a2}H_{b2}X_{c2}OC_{a1}H_{b1}X_{c1}$; $C_{a2}H_{b2}X_{c2}(C=O)$ $OC_{a1}H_{b1}X_{c1}$; or $C_{a2}H_{b2}X_{c2}O(C=O)C_{a1}H_{b1}X_{c1}$. $D_1$ and $D_1'$ are different from one another. X is a halogen atom or $NO_2$; a1 is an integer between 1 to 8; b1 is an integer between 0 and $2(a1)+1-c1$; c1 is an integer between 0 and $2(a1)+1-b1$; b1+c1 is at least 1; a2 is an integer between 0 and 8; b2 is an integer between 0 and $2(a2)+1-c2$; and c2 is an integer between 0 and $2(a2)+1-b2$. The process can be used in manufacturing or processing electronic devices.

23 Claims, 14 Drawing Sheets

1,1'-ethylmethylruthenocene    1,1'-isopropylmethyl ruthenocene 1,1'-isopropylethyl ruthenocene

U.S. PATENT DOCUMENTS

| | | | |
|---|---|---|---|
| 6,074,945 A | 6/2000 | Vaartstra et al. | 438/681 |
| 6,420,582 B1 | 7/2002 | Okamoto | |
| 6,440,495 B1 | 8/2002 | Wade et al. | 427/250 |
| 6,465,669 B1 * | 10/2002 | Okamoto | 556/136 |
| 6,482,740 B2 * | 11/2002 | Soininen et al. | 438/686 |
| 6,605,735 B2 * | 8/2003 | Kawano et al. | 556/136 |
| 2002/0064948 A1 | 5/2002 | Saito et al. | |
| 2002/0102826 A1 | 8/2002 | Shimamoto et al. | 438/575 |

FOREIGN PATENT DOCUMENTS

| | | |
|---|---|---|
| JP | 2001122887 A | 5/2001 |

* cited by examiner

DEPOSITION PROCESSES USING GROUP 8 (VIII) METALLOCENE PRECURSORS

RELATED APPLICATIONS

This application claims the benefit of U.S. Provisional Application No. 60/422,946, filed Oct. 31, 2002; U.S. Provisional Application No. 60/422,947, filed Oct. 31, 2002; U.S. Provisional Application No. 60/426,284, filed Nov. 14, 2002; U.S. Provisional Application No. 60/427,461, filed Nov. 18, 2002; U.S. Provisional Application No. 60/446,320, filed Feb. 7, 2003; U.S. Provisional Application No. 60/453,718, filed Apr. 18, 2003; U.S. Provisional Application No. 60/453,719, filed Apr. 18, 2003; and U.S. Provisional Application No. 60/453,717, filed Apr. 18, 2003. The entire teachings of the above-referenced applications are incorporated herein by reference.

BACKGROUND OF THE INVENTION

Chemical vapor deposition (CVD) methods are employed to form films of material on substrates such as wafers or other surfaces during the manufacture or processing of semiconductors. In CVD, a CVD precursor, also known as a CVD chemical compound, is decomposed thermally, chemically, photochemically or by plasma activation, to form a thin film having a desired composition. For instance, a vapor phase CVD precursor can be contacted with a substrate that is heated to a temperature higher than the decomposition temperature of the precursor, to form a metal or metal oxide film on the substrate.

Thin films that include ruthenium (Ru), ruthenium oxide ($RuO_2$) or iron (Fe) have good electrical conductivity, high work function, are chemically and thermally stable, resistant to inter-layer chemical diffusion and are compatible with many dielectric substrate materials. Ru and $RuO_2$ films, for instance, have been investigated as film electrode material for semiconductor devices such as DRAM (Dynamic Random Access Memory) devices.

Examples of films produced from ruthenium-based precursors are described in: U.S. Pat. No. 6,440,495 issued on Aug. 27, 2002, to Wade, et al.; U.S. Pat. No. 6,074,945 issued on Jun. 13, 2000, to Vaartstra, et al.; U.S. Patent Application Publication No. 2002/0102826, published on Aug. 1, 2002, with the title Fabricating Method of Semiconductor Integrated Circuits; J. Peck, et al.; Chemical Vapor Deposition of Novel Precursors for Advanced Capacitor Electrodes, Proceedings of the Symposium, Rapid Thermal and Other Short-Time Processing Technologies III, Electronics, Dielectric Science and Technology, and High Temperature Materials Divisions, Proceedings Volume 2002-11 pp. 235-242, 201$^{st}$ Electrochemical Society Meeting held in Philadelphia. The entire teachings of the above-referenced patents, published patent application and paper for meeting presentation are incorporated herein by reference.

Bis(pentahaptocyclopentadienyl)ruthenium (ruthenocene) and the symmetrical, diethyl-substituted ruthenocene (1,1'-diethylruthenocene) have been investigated as possible precursors for forming ruthenium-based thin films by CVD techniques.

These compounds have been prepared by several synthetic routes.

One existing method for forming ruthenocene includes the reaction of $RuCl_3 \cdot XH_2O$ with cyclopentadiene, in the presence of Zn, to produce ruthenocene, $ZnCl_2$ and HCl, as shown in FIG. 1A. A similar approach, using ethyl-substituted cyclopentadiene, has been employed to produce 1,1'-diethylruthenocene, as shown in FIG. 1B. Generally, yields obtained by this method are about 70%.

As shown in FIG. 1C, unsubstituted ruthenocene also has been prepared by the reaction of cyclopentadiene, chloro(cyclopentadienyl)bis(triphenylphosphine)ruthenium(II) and sodium hydride (NaH) in benzene. Chloro(cyclopentadienyl)bis(triphenylphosphine)ruthenium(II) precursor has been synthesized by reacting ruthenium trichloride and triphenylphosphine in ethanol.

Another method that has been investigated for the synthesis of ruthenocene includes the transmetallation reactions of a bis(alkylcyclopentadienyl)iron compound with $RuCl_3 \cdot XH_2O$ and results in the formation of low yield 1,1'-dialkylruthenocene, ron trichloride ($FeCl_3$) and difficult to separate iron species.

Monosubstituted ruthenocenes, e.g., 1-ethylruthenocene, are formed as an impurity during the synthesis of 1,1'-diethylruthenocene. Tert-butyl(cyclopentadienyl)(cyclopentadienyl)ruthenium also has been prepared by reacting a heated mixture of bis(cyclopentadienyl)ruthenium, aluminum chloride and polyphosphoric acid, with tert-butyl alcohol, followed by distillation.

Generally, synthetic methods described above often are associated with low yields, competing dimerization reactions, complex product separations, special handling techniques of dangerous reagents, e.g., NaH. Furthermore, as seen in FIGS. 1A and 1B, these synthetic approaches include a one step addition of both cycolpentadienyl rings and thus are suitable for preparing unsubstituted ruthenocene or the symmetrically substituted 1,1'-diethylruthenocene. Both ruthenocene and 1,1'-diethylruthenocene, have relatively low vapor pressure (less than 10 Torr at 100° C.). At room temperature, ruthenocene is a solid and 1,1'-diethyl-ruthenocene is a liquid.

Generally, more volatile CVD precursors are preferred, as are precursors that are liquid at room temperature, rather than solid. In addition, desired CVD precursors also are heat decomposable and capable of producing uniform films under suitable CVD conditions.

Therefore, a need exists for the continued investigation of ruthenium-based CVD precursors and for new film deposition processes. A need also exists for methods for producing films that include ruthenium or other Group 8 (VIII) metals.

SUMMARY OF THE INVENTION

The invention generally is related to a deposition process to produce a material, such as, for example, a film, coating or powder, that includes a Group 8 (VIII) metal and/or Group 8 (VIII) metal oxide. The process includes decomposing at least one asymmetrically substituted metallocene precursor, thereby forming the material. The asymmetrically substituted metallocene precursor is represented by the general formula CpMCp', where M is a metal selected from the group consisting of ruthenium (Ru), osmium (Os) and iron (Fe); Cp is a first substituted cyclopentadienyl or cyclopentadienyl-like (e.g., indenyl) moiety that includes at least one substituent group $D_1$; and Cp' is a second substituted cyclopentadienyl or cyclopentadienyl-like moiety (e.g., indenyl) that includes at least one substituent group $D_1'$. $D_1$ and $D_1'$ are different from each other and are independently selected from the group consisting of:

X;
$C_{a1}H_{b1}X_{c1}$;
$C_{a2}H_{b2}X_{c2}(C=O)C_{a1}H_{b1}X_{c1}$;
$C_{a2}H_{b2}X_{c2}OC_{a1}H_{b1}X_{c1}$;
$C_{a2}H_{b2}X_{c2}(C=O)OC_{a1}H_{b1}X_{c1}$; and
$C_{a2}H_{b2}X_{c2}O(C=O)C_{a1}H_{b1}X_{c1}$;

where
X is a halogen atom or nitro group ($NO_2$);
a1 is an integer from 1 to 8;
b1 is an integer from 0 to 2(a1)+1−c1;
c1 is an integer from 0 to 2(a1)+1−b1;
b1+c1 is at least 1;
a2 is an integer from 0 to 8;
b2 is an integer from 0 to 2(a2)+1−c2;
c2 is an integer from 0 to 2(a2)+1−b2.

In one embodiment, the invention is directed to a process for depositing a film The process includes the step of decomposing vapor of an asymmetric metallocene or metallocene-like compound, wherein decomposition is thermal, chemical, photochemical or by plasma activation and the metallocene or metallocene-like compound has the general formula CpMCp', described above, thereby forming the film on a substrate.

In preferred embodiments, $D_1$ is:
X;
$C_{a1}H_{b1}X_{c1}$;
$C_{a2}H_{b2}X_{c2}(C=O)C_{a1}H_{b1}X_{c1}$;
$C_{a2}H_{b2}X_{c2}OC_{a1}H_{b1}X_{c1}$;
$C_{a2}H_{b2}X_{c2}(C=O)OC_{a1}H_{b1}X_{c1}$; or
$C_{a2}H_{b2}X_{c2}O(C=O)C_{a1}H_{b1}X_{c1}$;
where
X is fluorine (F), chlorine (Cl), bromine (Br), iodine (I) or ($NO_2$);
a1 is an integer from 2 to 8;
b1 is an integer from 0 to 2(a1)+1−c1;
c1 is an integer from 0 to 2(a1)+1−b1;
b1+c1 is at least 1;
a2 is an integer from 0 to 8;
b2 is an integer from 0 to 2(a2)+1−c2;
c2 is an integer from 0 to 2(a2)+1−b2, and
$D_1'$ is:
X;
$C_{a1}H_{b1}X_{c1}$;
$C_{a2}H_{b2}X_{c2}(C=O)C_{a1}H_{b1}X_{c1}$;
$C_{a2}H_{b2}X_{c2}OC_{a1}H_{b1}X_{c1}$;
$C_{a2}H_{b2}X_{c2}(C=O)OC_{a1}H_{b1}X_{c1}$; or
$C_{a2}H_{b2}X_{c2}O(C=O)C_{a1}H_{b1}X_{c1}$;
where
X is F, Cl, Br, I or $NO_2$;
a1 is an integer from 1 to 8;
b1 is an integer from 0 to 2(a1)+1−c1;
c1 is an integer from 0 to 2(a1)+1−b1;
b1+c1 is at least 1;
a2 is an integer from 0 to 8;
b2 is an integer from 0 to 2(a2)+1−c2;
c2 is an integer from 0 to 2(a2)+1−b2.

One specific example of a metallocene compound employed in the process of the invention is 1-methyl,1'-ethylruthenocene.

At least one of Cp or Cp' can include one or more additional substituents, e.g., $D_2$, $D_3$, $D_4$, $D_5$, $D_2'$, $D_3'$, $D_4'$, and $D_5'$.

The compounds described above provide additional options and flexibility to existing methods for producing Ru-, Os-, or Fe-based thin films by CVD. Some of these compounds, for example, are liquid at room temperature and have higher vapor pressure than conventional precursors. It has been found, for instance, that 1-methyl,1'-ethylruthenocene has a higher vapor pressure than 1,1'-diethylruthenocene. Higher vapor pressure presents economic advantages such as increased productivity and lower film manufacturing costs. Functionalization of the cyclopentadienyl rings in the compounds of the invention is believed to modify properties such as solubility, vapor pressure, decomposition, combustion and other reaction pathways, reduction/oxidation potentials, geometry, preferred orientations and electron density distribution through modification of the cyclopentadienyl rings. Thus a specific precursor can be selected for a desired application. Except for hydrogen and carbon, many of the precursors described herein, such as, for instance, alkyl-substituted metallocenes, do not include extraneous atoms and thus materials formed by their decomposition generally are free from impurities. In some other cases, the presence of oxygen atoms in the organic substituent groups may favor the formation of metal oxide films, coatings or powders.

DETAILED DESCRIPTION OF THE INVENTION

Figure 1A:
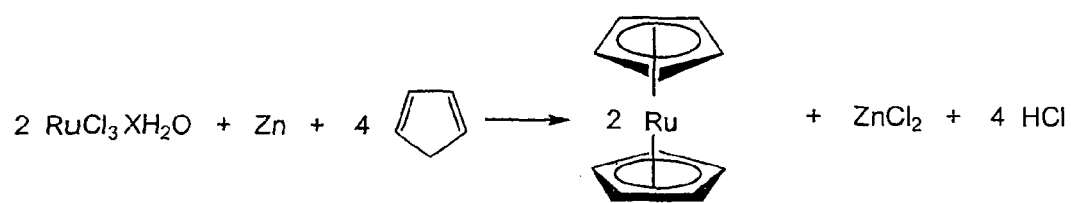
FIG. 1A depicts a prior art synthetic route for forming unsubstituted ruthenocene.
Figure 1B:
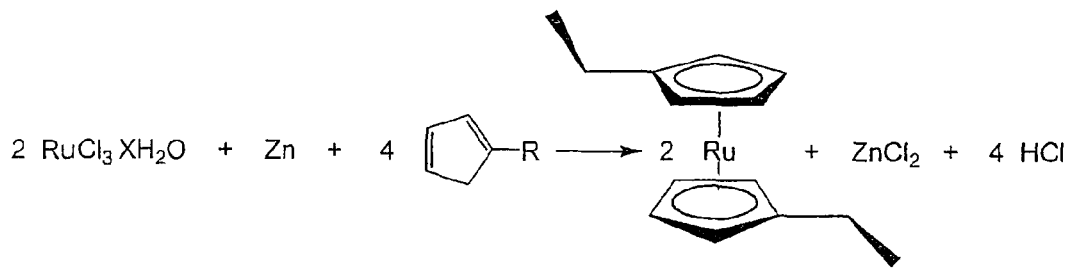
FIG. 1B depicts a prior art synthetic route for forming 1,1'-diethylruthenocene.
Figure 1C:
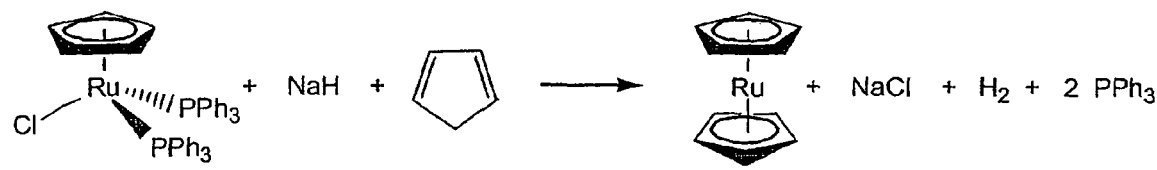
FIG. 1C depicts another prior art method that has been used to form unsubstituted ruthenocene.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

The invention generally is related to a process for producing a film, coating or powder. The process includes the step of decomposing at least one asymmetrically substituted Group 8 (VIII) metallocene compound, further described below. As used herein the term "metallocene" refers to an organometallic coordination compound having a sandwich-type structure similar to that of ferrocene, in which a transition metal is believe to be π-bonded (electrons are moving in orbitals extending above and below the ring) to η″-coordinated cyclic, generally aromatic moieties, Cp and Cp′, where n indicates the number of carbon atoms in the cyclic moiety that are bonded to the transition metal.

In preferred embodiments, both Cp and Cp′ are independently selected to be cyclopentadienyl or indenyl (a fused phenyl and cyclopentadienyl ring). If all carbon atoms in the cyclopentadienyl ring participate in bonding to the transition metal, these moieties are described as $\eta^5$-coordinated. Thus a complete description of ferrocene would be $(\eta^5\text{-}C_5H_5)_2Fe$.

Figure 2A:
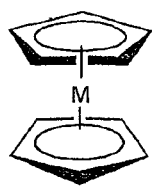
FIG. 2A shows the molecular formula of a metallocene in a staggered conformation.
Figure 2B:
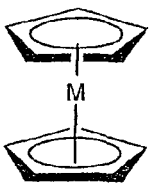
FIG. 2B shows the molecular formula of a metallocene in an eclipsed conformation.

Shown in FIG. 2A is a staggered conformation of a metallocene, where M is a Group 8 (VIII) metal, e.g., ruthenium, osmium or iron. Metallocenes also can have an eclipsed conformation, as shown in FIG. 2B. As used herein, molecular formulae are not intended to depict a particular metallocene conformation.

η″-coordinated moieties other than cyclopentadienyl are referred to herein as "cyclopentadienyl-like". Additional counterion groups may be present in such compounds to balance electrical charges and form neutral molecules, as known in the art.

The metallocene compounds employed in the process of the invention have the general formula CpMCp′, where M is Ru, Os or Fe and where Cp and Cp′ are cyclopentadienyl or cyclopentadienyl-like, e.g., indenyl, moieties. Each of Cp and Cp′ is substituted and Cp is different from Cp′.

More specifically, in each of the Cp and Cp′ moiety, at least one hydrogen (H) atom is replaced by a substituent group, $D_1$ and $D_1'$, respectively.

$D_1$ and $D_1'$ are different from each other and are independently selected from the group consisting of:
X;
$C_{a1}H_{b1}X_{c1}$;
$C_{a2}H_{b2}X_{c2}(C=O)C_{a1}H_{b1}X_{c1}$;
$C_{a2}H_{b2}X_{c2}OC_{a1}H_{b1}X_{c1}$;
$C_{a2}H_{b2}X_{c2}(C=O)OC_{a1}H_{b1}X_{c1}$; and
$C_{a2}H_{b2}X_{c2}O(C=O)C_{a1}H_{b1}X_{c1}$;
where
X is a halogen atom or nitro group ($NO_2$);
a1 is an integer from 1 to 8;
b1 is an integer from 0 to 2(a1)+1−c1;
c1 is an integer from 0 to 2(a1)+1−b1;
b1+c1 is at least 1;
a2 is an integer from 0 to 8;
b2 is an integer from 0 to 2(a2)+1−c2;
c2 is an integer from 0 to 2(a2)+1−b2.

As used herein, integer ranges are inclusive. Straight as well as branched substituent groups $D_1$ and $D_1'$ can be employed. For example, $D_1$ and/or $D_1'$ can be a straight or branched C1-C8 alkyl group.

In one embodiment of the invention, $D_1$ is:
X;
$C_{a1}H_{b1}X_{c1}$;
$C_{a2}H_{b2}X_{c2}(C=O)C_{a1}H_{b1}X_{c1}$;
$C_{a2}H_{b2}X_{c2}OC_{a1}H_{b1}X_{c1}$;
$C_{a2}H_{b2}X_{c2}(C=O)OC_{a1}H_{b1}X_{c1}$; and
$C_{a2}H_{b2}X_{c2}O(C=O)C_{a1}H_{b1}X_{c1}$;
where
X is a halogen atom e.g., fluorine (F), chlorine (Cl), bromine (Br) or iodine (I);
a1 is an integer from 2 to 8;
b1 is an integer from 0 to 2(a1)+1−c1
c1 is an integer from 0 to 2(a1)+1−b1;
b1+c1 is at least 1;
a2 is an integer from 0 to 8;
b2 is an integer from 0 to 2(a2)+1−c2;
c2 is an integer from 0 to 2(a2)+1−b2; and
$D_1'$ is:
X;
$C_{a1}H_{b1}X_{c1}$;
$C_{a2}H_{b2}X_{c2}(C=O)C_{a1}H_{b1}X_{c1}$;
$C_{a2}H_{b2}X_{c2}OC_{a1}H_{b1}X_{c1}$;
$C_{a2}H_{b2}X_{c2}(C=O)OC_{a1}H_{b1}X_{c1}$; and
$C_{a2}H_{b2}X_{c2}O(C=O)C_{a1}H_{b1}X_{c1}$;
where
X is a halogen atom;
a1 is an integer from 1 to 8;
b1 is an integer from 0 to 2(a1)+1−c1;
c1 is an integer from 0 to 2(a1)+1−b1;
b1+c1 is at least 1;
a2 is an integer from 0 to 8;
b2 is an integer from 0 to 2(a2)+1−c2;
c2 is an integer from 0 to 2(a2)+1−b2.

In one example, $D_1$ is selected from:
$C_{a1}H_{b1}X_{c1}$;
$C_{a2}H_{b2}X_{c2}(C=O)C_{a1}H_{b1}X_{c1}$;
$C_{a2}H_{b2}X_{c2}OC_{a1}H_{b1}X_{c1}$;
$C_{a2}H_{b2}X_{c2}(C=O)OC_{a1}H_{b1}X_{c1}$; or
$C_{a2}H_{b2}X_{c2}O(C=O)C_{a1}H_{b1}X_{c1}$.
where:
X is a halogen atom e.g., F, Cl, Br or I;
a1 is an integer from 1 to 8;
b1 is an integer from 0 to 2(a1)+1−c1;
c1 is an integer from 0 to 2(a1)+1−b1;
b1+c1 is equal to or greater than 1;
a2 is an integer from 0 to 8;
b2 is an integer from 0 to 2(a2)+1−c2;
c2 is an integer from 0 to 2(a2)+1−b2;
b2+c2 is equal to or greater than 1;
and $D_1'$ is selected from:
$C_{a1}H_{b1}X_{c1}$,
$C_{a2}H_{b2}X_{c2}(C=O)C_{a1}H_{b1}X_{c1}$,
$C_{a2}H_{b2}X_{c2}OC_{a1}H_{b1}X_{c1}$,
$C_{a2}H_{b2}X_{c2}(C=O)OC_{a1}H_{b1}X_{c1}$,
$C_{a2}H_{b2}X_{c2}O(C=O)C_{a1}H_{b1}X_{c1}$;
where,
X is a halogen atom e.g. F, Cl, Br or I;
a1 is an integer from 1 to 8;
b1 is an integer from 0 to 2(a1)+1−c1
c1 is an integer from 0 to 2(a1)+1−b1
b1+c1 is equal to or greater than 1
a2 is an integer from 0 to 8
b2 is an integer from 0 to 2(a2)+1−c2
c2 is an integer from 0 to 2(a2)+1−b2
b2+c2 is equal to or greater than 1.

In another example, $D_1$ is a halogen atom, X, e.g., F, Cl, Br or I; and $D_1'$ is selected from:
$C_{a1}H_{b1}X_{c1}$,
$C_{a2}H_{b2}X_{c2}(C=O)C_{a1}H_{b1}X_{c1}$,
$C_{a2}H_{b2}X_{c2}OC_{a1}H_{b1}X_{c1}$, $C_{a2}H_{b2}X_{c2}(C=O)OC_{a1}H_{b1}X_{c1}$,
$C_{a2}H_{b2}X_{c2}O(C=O)C_{a1}H_{b1}X_{c1}$
where,
X is a halogen atom
A1 is an integer from 2 to 8;
b1 is an integer from 0 to 2(a1)+1−c1
c1 is an integer from 0 to 2(a1)+1−b1
b1+c1 is equal to or greater than 1
a2 is an integer from 0 to 8
b2 is an integer from 0 to 2(a2)+1−c2
c2 is an integer from 0 to 2(a2)+1−b2
b2+c2 is equal to or greater than 1.

Figure 3:
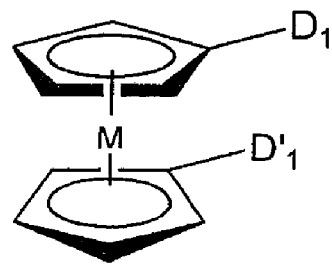
FIG. 3 shows the structural formula of a disubstituted metallocene compound.

One example of the structural formula of a metallocene compound (CpMCp') of the invention is shown in FIG. 3.

Optionally, either or both Cp and Cp' moieties of the metallocene or metallocene-like compounds of the invention further include one or more additional substituent group, $D_x$. In one example, at least one of Cp and Cp' is a multi-substituted cyclopentadienyl or indenyl moiety.

Figure 4:
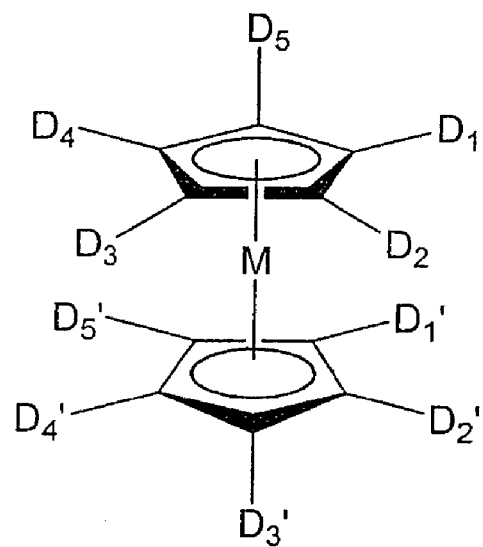
FIG. 4 shows a generalized structural formula of a metallocene that can be employed in the process of the invention.

A generalized structural formula of a CpMCp' metallocene compound of the invention is shown in FIG. 4. $D_1$ and $D_1'$ are independently selected as described above. $D_2$, $D_3$, $D_4$, $D_5$, $D_2'$, $D_3'$, $D_4'$, and $D_5'$ are independently selected from:
$C_{a1}H_{b1}X_{c1}$,
$C_{a2}H_{b2}X_{c2}(C=O)C_{a1}H_{b1}X_{c1}$,
$C_{a2}H_{b2}X_{c2}OC_{a1}H_{b1}X_{c1}$,
$C_{a2}H_{b2}X_{c2}(C=O)OC_{a1}H_{b1}X_{c1}$, or
$C_{a2}H_{b2}X_{c2}O(C=O)C_{a1}H_{b1}X_{c1}$
where,
a1 is an integer from 0 to 8
b1 is an integer from 0 to 2(a1)+1−c1
c1 is an integer from 0 to 2(a1)+1−b1
b1+c1 is equal to or greater than 1
a2 is an integer from 0 to 8
b2 is an integer from 0 to 2(a2)+1−c2
c2 is an integer from 0 to 2(a2)+1−b2
b2+c2 is equal to or greater than 1

Figure 5:
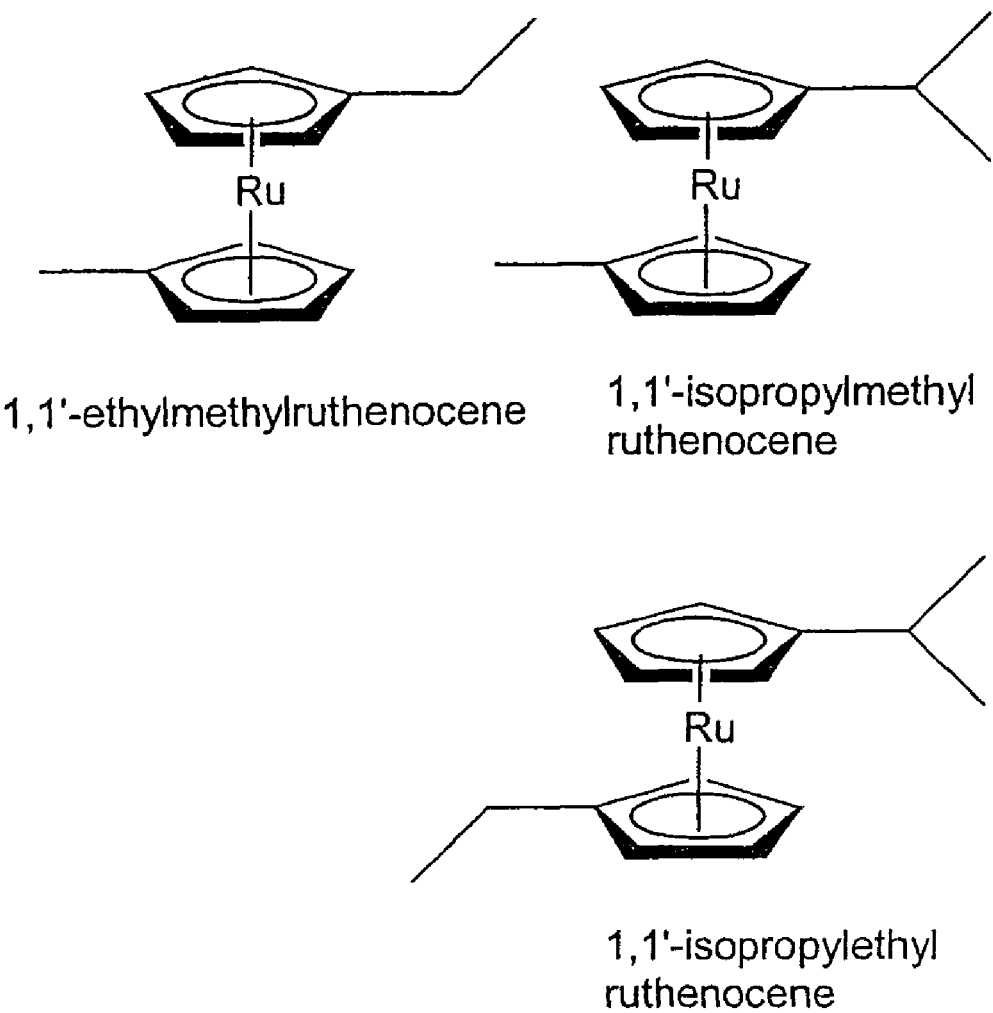
FIG. 5 shows illustrative asymmetric ruthenocene compounds.

Specific examples of ruthenium-based metallocene compounds that can be used in the invention are shown in Table 1 and in FIG. 5.

TABLE 1

| | |
|---|---|
| 1-methyl,1'-ethylruthenocene | 1,2-dimethyl,1'-ethylruthenocene |
| 1-methyl,1'-propylruthenocene | 1-methyl,1',3-diethylruthenocene |
| 1-methyl,1'-isopropylruthenocene | 1-methyl,1',2-diethylruthenocene |
| 1-methyl,1'-butylruthenocene | 1-methyl,1'-ethyl,3-propylruthenocene |
| 1-methyl,1'-secbutylruthenocene | 1-methyl,1'-propyl,3-ethylruthenocene |
| 1-methyl,1'-tertbutylruthenocene | 1-ethyl,1'-methyl,3-propylruthenocene |
| 1-ethyl,1'-propylruthenocene | 1-methyl,1'-ethyl,2-propylruthenocene |
| 1-ethyl,1'-isopropylruthenocene | 1-methyl,1'-propyl,2-ethylruthenocene |
| 1-ethyl,1'-butylruthenocene | 1-ethyl,1'-methyl,2-propylruthenocene |
| 1-ethyl,1'-secbutylruthenocene | 1-methyl,1'-propylruthenocene |
| 1-ethyl,1'-tertbutylruthenocene | 1-methyl-1'-ethylruthenocene |
| 1-propyl,1'-isopropylruthenocene | 1,3-dimethyl-1'-ethylruthenocene |
| 1-propyl,1'-butylruthenocene | 1,2,1'-dmethyl-3'-ethylruthenocene |
| 1-propyl,1'-secbutylruthenocene | 1-butyl-1'-acetylruthenocene |
| 1-propyl,1'-tertbutylruthenocene | 1-ethyl-1'-methoxyruthenocene |
| 1-isopropyl,1'-butylruthenocene | 1-ethyl-1'-methoxy-2-ethoxyruthenocene |
| 1-isopropyl,1'-secbutylruthenocene | 1,2,3,4-tetramethyl-1'-ethylruthenocene |
| 1-isopropyl,1'-tertbutylruthenocene | 1-acetyl,1'-ethoxyruthenocene |
| 1-butyl,1'-secbutylruthenocene | 1-difluoromethyl-1'-ethylruthenocene |
| 1-butyl,1'-tertbutylruthenocene | 1-trifluoromethyl,2,3,4-fluoro-1'-triflouromethylruthenocene |
| 1-secbutylruthenocene,1'-tertbutylruthenocene | 1-ethenyl-1'-fluororuthenocene |

TABLE 1-continued

| | |
|---|---|
| 1,1',3-trimethylruthenocene | 1-ethoxymethyl-1',2'-diethylruthenocene |
| 1,1',2-trimethylruthenocene | 1-ethyl,1'-propanoylruthenocene |
| 1,3-dimethyl,1'-ethylruthenocene | 1,1',2,4-triethyl-3'-acetylruthenocene |

The metallocene compounds that can be employed in the invention also include osmium-based and iron-based compounds similar to those shown in Table 1 or FIG. 5. Similarly, the method of the invention can be used to form metallocenes including other $\eta''$-coordinated aromatic moieties.

Suitable metallocene compounds that are employed in the process of the invention are disclosed in U.S. Patent Application by David M. Thompson and Cynthia A. Hoover, with the title Asymmetric Group 8 (VIII) Metallocene Compounds, filed concurrently herewith under Ser. No. 10/686,254, the entire teachings of which are incorporated herein by reference.

A suitable synthetic method for preparing metallocene compounds that are employed in the process of the invention is disclosed in U.S. Patent Application, by David M. Thompson and Cynthia A. Hoover with the title of Methods for Making Metallocene Compounds, filed concurrently herewith, under Ser. No. 10/685,777, the entire teachings of which are incorporated herein by reference.

The metal salt can be a metal (III) salt, such as, for example, a metal halide (e.g., chloride, bromide, iodide, fluoride), a metal nitrate and other suitable metal salts. M is a Group 8 (VIII) metal, e.g., Ru, Os or Fe. Generally, the metal salt is abbreviated as $MX_n$. As used herein, the abbreviation $MX_n$ does not exclude metal salt compounds that include water of hydration and that, as known in the art, can be more specifically represented by the formula $MX_n \cdot \mu H_2O$, $\mu$ being other than 0. Thus in specific examples, the abbreviation $FeX_3$ used herein includes anhydrous as well as hydrated iron salts that can be employed to form ferrocenes or ferrocene-like compounds.

The metal (M) salt (X) can be a metal (III) salt, such as, for example, a metal halide (e.g., chloride, bromide, iodide, fluoride), a metal nitrate and other suitable metal salts. The metal is represented more specifically by the formula $MX_n$ or, if water of hydration is present, by $MX_n \cdot \mu H_2O$. M is Ru, Os or Fe. Metal salts, such as, for instance, $FeX_3 \cdot \eta H_2O$, or $FeX_3$, are employed to form ferrocenes or ferrocene-like compounds.

Ligand (L) generally is an electron pair donor compound. A neutral electron air donor, such as, for example, triphenylphosphine ($PPh_3$) is employed in one example. Tricyclohexylphosphine and other phosphines of the general formula $PR_3$, as well as phosphite triesters, $P(OR)_3$, where R is phenyl, cyclohexyl, alkyl or branched alkyl, e.g., t-butyl, group, also can be employed. Other suitable electron pair donors include amines, phosphates, carbonyl compounds, olefins, polyolefins, chelating phosphines, chelating amines and others.

The Cp compound is a precursor of the Cp moiety in the CpMCp' compound described above. Preferably the Cp compound is HCp, e.g., cyclopentadiene or indene. The Cp component also can be provided as a salt of a cyclopentadienyl or indenyl anion, e.g., potassium cyclopentadienyl (KCp), sodium cyclopentadienyl (NaCp), lithium cyclopentadienyl (LiCp) and others. Suitable cations for use with a cyclopentadienyl anion in the synthetic method described herein include trimethylsilyl (TMS), Na, Li, K, Mg, Ca and Tl.

At least one hydrogen atom in the Cp moiety is replaced by a group $D_1$, as described above. Specific examples of HCp include, methylcyclopentadiene, ethylcyclopentadiene, n-propyl- or isopropylcyclopentadiene, n-butyl-, sec-butyl- or tert-butylcyclopentadiene, or halo-cyclopentadiene.

The Cp compound also can be di- or multi-substituted, e.g., it can be a di-, tri-, tetra- and penta-substituted-cyclopentadiene. Specific examples of substituent groups $D_2$, $D_3$, $D_4$ and $D_5$ are described above.

Each of the $MX_n$, L and HCp components can be provided in neat form or can optionally include a suitable solvent. Preferred solvents that can be employed in the method of the invention include alcohols, such as, for instance, ethanol, methanol, isopropanol and other alcohols. Ethyl acetate, tetrahydrofuran (THF), saturated or unsaturated hydrocarbons, aromatic heterocycles, alkyl halides, silylated hydrocarbons, ethers, polyethers thioethers, esters, lactones, amides, amines, polyamines, nitriles, silicone oils and other aprotic solvents also can be employed. Combinations of solvents also can be employed.

Generally, concentrations of $MX_n$, L and Cp are selected as known in the art. For example, the molar concentration of $MX_n$ in a suitable solvent can be in the range of from about 0.1M to neat. That of L in a suitable solvent can be in the range of from about 0.1M to neat. The molar concentration of Cp in a suitable solvent can be in the range of from about 0.1 to neat. If neat phosphine is employed it is believed that the reaction would be highly exothermic. Methods and systems for dissipating substantial amounts of heat of reaction per unit volume are known in the art.

The three components can be combined in any order. In one example, the metal component and the HCp component are added concurrently to the L component. In another embodiment, the metal component and the HCp component are combined to form a mixture and then the mixture is combined with the L component, for instance by adding the L component to the mixture. In yet another embodiment, all components are combined at the same time.

Typically the molar ratio of HCp to $MX_n$ used is in the range from about 50 to about 1, preferably from about 12 to about 2 and most preferably in the range from about 7 to about 5. Typically, the molar ratio of L to $MX_n$ is in the range of from about 8 to about 0, preferably from about 6 to about 2 and most preferably from about 5 to about 3.5. If a large excess amount of HCp component is employed, the reaction is driven to forming $(Cp)_2M$ product.

The reaction temperature preferably is around the boiling point of the solvent employed or the boiling point of the reaction mixture. Other suitable temperatures can be determined by routine experimentation. Generally, the reaction can be conducted at a temperature that is in the range of from above the freezing point to about the boiling point of the reaction composition. For instance, the reaction can be conducted at a temperature in the range of from about −100° C. to about 150° C.

The time of reaction generally depends on temperature, and concentration of the various reactants, and can range, for example, from about 5 minutes to about 96 hours.

The intermediate component formed by the reaction of the $MX_n$, L and HCp can be represented by the formula $CpML_fX$, where f=1 or 2.

In one example, $CpML_fX$ is isolated, e.g., as a solid, by methods known in the art. Intermediate compound, $CpML_fX$, is then reacted with a Cp' compound, preferably in the presence of a solvent. The Cp' compound preferably includes an anion of the Cp' moiety in the compounds of the invention described above. Counterions can include trimethylsilyl (TMS), Na, Li, K, Mg, Ca, Tl. Specific examples of cyclopentadienyl compounds that can be used include, but are not limited to sodium or lithium ethylcyclopentadienide, sodium or lithium methylcyclopentadienide, sodium or lithium isopropylcyclopentadienide and others. Di- or multi-substituted anions of the Cp' moiety also can be employed (e.g., di-, tri-, tetra- or penta-substituted cyclopentadienyl anions). Anions of unsubstituted indenes, cyclic poly-olefins, polycyclic unsaturated hydrocarbons, heterocycles, aromatic rings also can be employed, as described above.

In a specific example, the intermediate compound is $CpRu(PPh_3)_2Cl$. It is reacted with a salt of Cp'. Recommended salts of Cp' include NaCp', LiCp', (Cp')$_2$Mg, TMS(Cp') and (Cp')Tl.

Examples of suitable solvents include benzene, toluene, xylenes, pentanes, hexanes, petroleum ether, aromatic heterocycles, saturated or unsaturated hydrocarbons, alkyl halides, silylated hydrocarbons, ethers, polyethers, thioethers, esters, lactones, amides, amines, polyamines, nitriles, silicones, and others.

Generally, the molar concentrations of the Cp' component in a solvent can be in the range of from about 0.1 M to about 3.5 M, preferably in the range of from about 0.5 M to about 2.5 M and most preferably in the range of from about 1.4 to about 1.8 M.

Typically, the molar ratio of Cp' relative to the $CpML_fX$ is in the range from about 50 to about 1, preferably from about 6 to about 1 and most preferably from about 1.6 to about 1.2.

In another example the intermediate $CpML_fX$ is not isolated. Following its formation in solution, a Cp' compound, such as a salt described above, is added to the solution that includes $CpML_fX$.

The reaction between the Cp' component and the intermediate $CpML_fX$ (whether isolated or not) is conducted at a temperature such as generally described above and results in the formation of CpMCp' product.

The time of reaction generally depends on temperature, and concentration of the various reactants, and can range from about 15 minutes to about 6 days.

When synthesizing structures of the type CpRuCp' in which one of the rings contains a ketone, ester or ether functionality, it is preferred that the ring with the greater number of ketones, esters or ethers is identified as the Cp' ring, and that it is added to the intermediate as a TMS salt.

The product of the reaction, CpMCp', can be isolated and or purified by methods known in the art, such as, for example, solvent, e.g., hexane, extraction followed by distillation, sublimation or chromatography or directly by distillation, sublimation or chromatography. Recrystallization, ultracentrifugation and other techniques also can be employed. Alternatively, the product can be employed in the reaction mixture without further isolation and or purification.

Figure 6:
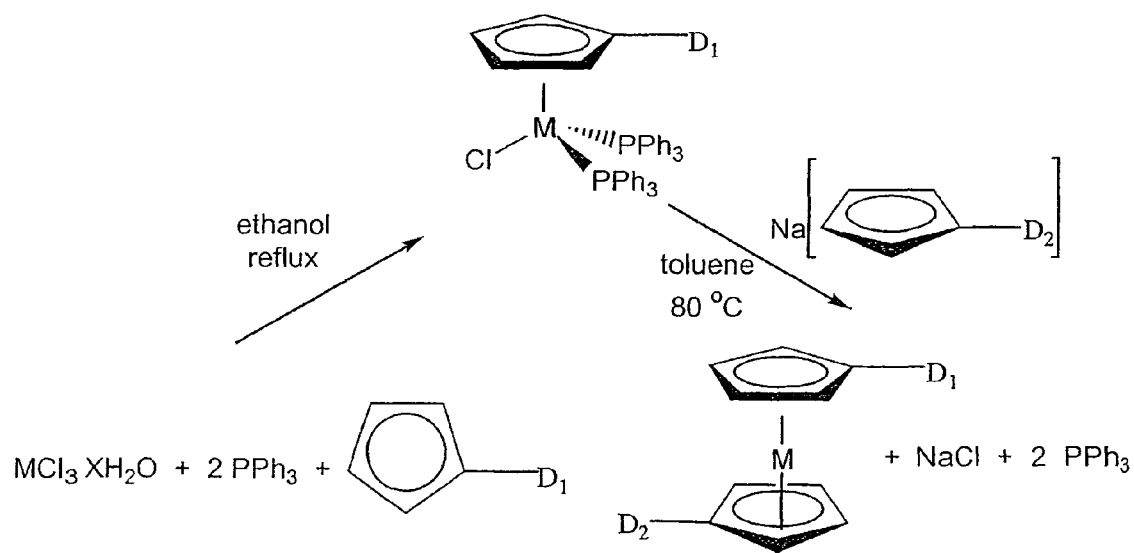
FIG. 6 depicts a synthetic method that can be employed to form a metallocene precursor that can be employed in the process of the invention.

A method for forming the compounds of the invention is described by the chemical reaction shown in FIG. 6. In the method depicted in FIG. 6, $MCl_3 \cdot \mu H_2O$, triphenylphosphine and a $D_1$-substituted cyclopentadiene react in ethanol, under reflux, to form intermediate compound $CpM(PPh_3)_2Cl$, which then reacts with sodium $D_1$'-substituted cyclopentadienide to form CpMCp'.

Either or both Cp and/or Cp' can include additional substituent groups, $D_x$, such as, for instance, groups described above. Thus either or both Cp and/or Cp' can be a di-, tri-, tetra- or penta-substituted cyclopentadiene moiety.

Figure 7:
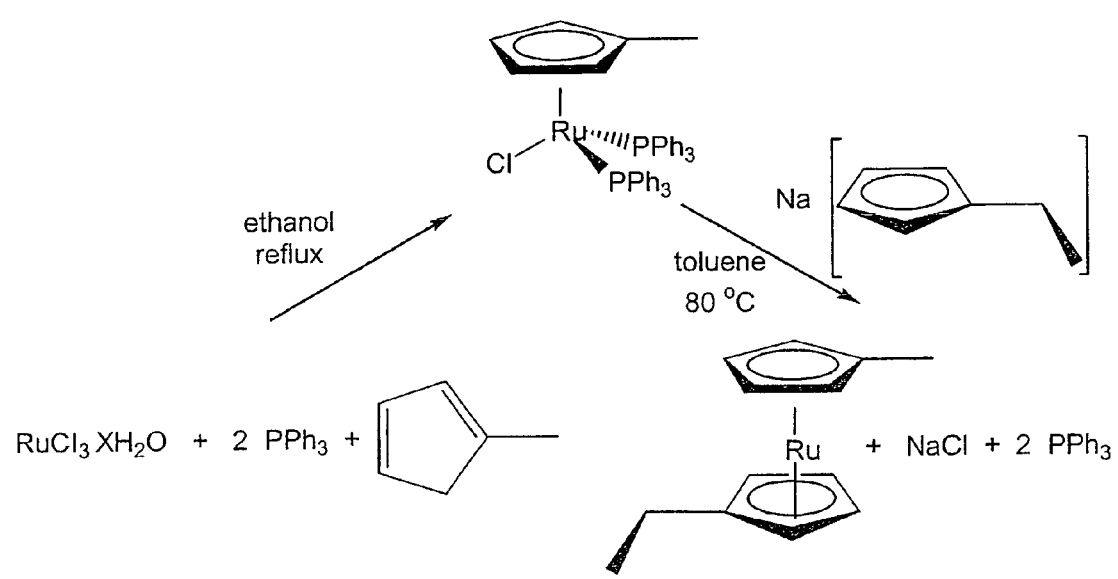
FIG. 7. shows a synthetic method that can be employed to form 1-methyl,1'-ethylruthenocene.

A synthetic scheme that can be employed to form a specific di-substituted asymmetric ruthenocene, i.e., 1-methyl,1'-ethylruthenocene or (methylcycplopentadienyl)ethylcyclopentadienyl)ruthenium), is shown in FIG. 7. As shown in FIG. 7, $RuCl_3 \cdot XH_2O$, triphenylphosphine and methylcyclopentadiene react in ethanol, under reflux, to form intermediate compound chloro(methylcyclopentadienyl)bis(triphenylphosphine)ruthenium(II) or ($\eta^5$-C$_5$H$_4$C$_2$H$_5$)Ru(PPh$_3$)$_2$Cl, which then reacts with a sodium ethylcyclopentadienide to form 1-methyl,1'-ethylruthenocene.

Examples of techniques that can be employed to characterize the compounds formed by the synthetic methods described above include, but are not limited to, analytical gas chromatography, nuclear magnetic resonance (NMR), thermogravimetric analysis (TGA), inductively coupled plasma mass spectrometry (ICPMS), vapor pressure and viscosity measurements.

Relative vapor pressures, or relative volatility, of precursors described above can be measured by thermogravimetric analysis techniques known in the art. Equilibrium vapor pressures also can be measured, for example by evacuating all gases from a sealed vessel, after which vapors of the compounds are introduced to the vessel and the pressure is measured as known in the art.

Without being held to a particular mechanism, it is believed that specific functionalization of the Cp and Cp' rings to tailor the properties of Group 8 (VIII) metallocenes, such as solubility, vapor pressure, decomposition, combustion and other reaction pathways, reduction/oxidation potentials, geometry, preferred orientations and electron density distribution. For example, it is believed that larger substituent $D_1$ and/or $D_1'$ contribute to an increase in molecular entropy and that metallocene compounds described herein are more likely to be liquid at room temperature in comparison to previously disclosed compounds.

In the process of the invention, a metallocene compound described above is decomposed and the organic moieties are eliminated, resulting in the formation of a Group 8 (VIII) metal-based or Group 8 (VIII) metal oxide-based film, coating or powder.

Precursors described herein that are liquid at room temperature are well suited for preparing in-situ powders and coatings. For instance, a liquid precursor can be applied to a substrate and then heated to a temperature sufficient to decompose the precursor, thereby eliminating the organic groups and forming a metal or metal oxide coating on the substrate. Applying a liquid precursor to the substrate can be by painting, spraying, dipping or by other techniques known in the art. Heating can be conducted in an oven, with a heat gun, by electrically heating the substrate, or by other means, as known in the art. A layered coating can be obtained by applying a precursor, and heating and decomposing it, thereby forming a first layer, followed by at least one other coating with the same or a different precursors, and heating.

Liquid metallocene precursors such as described above also can be atomized and sprayed onto a substrate. Atomization and spraying means, such as nozzles, nebulizers and others, that can be employed are known in the art.

In preferred embodiments of the invention, a metallocene or metallocene-like compound, such as described above, is employed in gas phase deposition techniques for forming powders, films or coatings. The compound can be employed as a single source precursor or can be used together with one or more other precursors, for instance, with vapor generated by heating at least one other organometallic compound or metal complex. More than one metallocene precursors, such as described above, also can be employed in a given process.

Deposition can be conducted in the presence of other gas phase components. In one embodiment of the invention, film deposition is conducted in the presence of at least one non-reactive carrier gas. Examples of non-reactive gases include inert gases, e.g., nitrogen, argon, helium, as well as other gases that do not react with the precursor under process conditions. In other embodiments, film deposition is conducted in the presence of at least one reactive gas. Some of the reactive gases that can be employed include but are not limited to hydrazine, oxygen, hydrogen, air, oxygen-enriched air, ozone (O$_3$), nitrous oxide (N$_2$O), water vapor, organic vapors and others. As known in the art, the presence of an oxidizing gas, such as, for example, air, oxygen, oxygen-enriched air, O$_3$, N$_2$O or a vapor of an oxidizing organic compound, favors the formation of a metal oxide film. It is believed that the presence or oxygen atoms in the $D_1$, $D_1'$, $D_x$ and $D_x'$ organic groups also favors the formation of metal oxides.

Deposition processes described herein can be conducted to form a film, powder or coating that includes a single metal, e.g, an Os-film, or a film, powder or coating that includes a single metal oxide, e.g., RuO$_2$. Mixed films, powders or coatings also can be deposited, for instance mixed metal oxide films. A mixed metal oxide film can be formed, for example, by employing several organometallic precursors, at least one of which being selected from the metallocene or metallocene-like compounds described above.

Gas phase film deposition can be conducted to form film layers of a desired thickness, for example, in the range of from about 1 nm to over 1 mm. The precursors described herein are particularly useful for producing thin films, e.g., films having a thickness in the range of from about 10 nm to about 100 nm. Films of ruthenium, for instance, can be considered for fabricating metal electrodes, in particular as p-channel metal electrodes in logic, and as capacitor electrodes for DRAM applications.

The process also is suited for preparing layered films, wherein at least two of the layers differ in phase or composition. Examples of layered film include metal-insulator-semiconductor (MIS), and metal-insulator-metal (MIM).

In one embodiment, the invention is directed to a process that includes the step of decomposing vapor of a metallocene or metallocene-like precursor described above, e.g., one of the compounds shown in Table 1, thermally, chemically, photochemically or by plasma activation, thereby forming a film on a substrate. For instance, vapor generated by the compound, preferably a liquid at room temperature, is contacted with a substrate having a temperature sufficient to cause the metallocene compound to decompose and form a film that includes a Group 8 (VIII) metal or Group 8 (VIII) metal oxide on the substrate.

The precursors can be employed in CVD or, more specifically, in metallo-organic chemical vapor deposition (MOCVD) processes known in the art. For instance, the precursors described above can be used in atmospheric, as well as in low pressure, CVD processes. The compounds can be employed in hot wall CVD, a method in which the entire reaction chamber is heated, as well as in cold or warm wall type CVD, a technique in which only the substrate is being heated.

The precursors described above also can be used in plasma or photo-assisted CVD processes, in which the energy from a plasma or electromagnetic energy, respectively, is used to activate the CVD precursor. The compounds also can be employed in ion-beam, electron-beam assisted CVD processes in which, respectively, an ion beam or electron beam is directed to the substrate to supply energy for decomposing a CVD precursor. Laser-assisted CVD processes, in which laser light is directed to the substrate to affect photolytic reactions of the CVD precursor, also can be used.

The process of the invention can be conducted in various CVD reactors, such as, for instance, hot or cold-wall reactors, plasma-assisted, beam-assisted or laser-assisted reactors, as known in the art.

Precursors that are liquid at room temperature often are preferred during CVD manufacturing and several asymmetric ruthenocene compounds described above have properties that make them suitable as CVD precursors. 1-methyl, 1'-ethylruthenocene, for instance, has a melting point of 2° C. 1-ethyl, 1'-isopropylruthenocene has a melting point of 3° C.; 1-methyl,1'-isopropylruthenocene is a liquid at room temperature. The previously used symmetric 1,1'-diethylruthenocene, has a melting point of 6° C., while 1-ethylruthenocene has a melting point of 12° C.

Examples of substrates that can be coated employing the process of the invention include solid substrates such as metal substrates, e.g., Al, Ni, Ti, Co, Pt, Ta; metal silicides, e.g., $TiSi_2$, $CoSi_2$, $NiSi_2$; semiconductor materials, e.g., Si, SiGe, GaAs, InP, diamond, GaN, SiC; insulators, e.g., $SiO_2$, $Si_3N_4$, $HfO_2$, $Ta_2O_5$, $Al_2O_3$, barium strontium titanate (BST); barrier materials, e.g., TiN, TaN; or on substrates that include combinations of materials. In addition, films or coatings can be formed on glass, ceramics, plastics, thermoset polymeric materials, and on other coatings or film layers. In preferred embodiments, film deposition is on a substrate used in the manufacture or processing of electronic components. In other embodiments, a substrate is employed to support a low resistivity conductor deposit that is stable in the presence of an oxidizer, at high temperature, e.g., a Ru metal or $RuO_2$ film, or an optically transmitting film, e.g., $RuO_2$.

The process of the invention can be conducted to deposit a film on substrate that has a smooth, flat surface. In a preferred embodiment, the process is conducted to deposit a film on a substrate used in wafer manufacturing or processing. For instance, the process can be conducted to deposit a film on patterned substrates that include features such as trenches, holes or vias. Furthermore, the process of the invention also can be integrated with other steps in wafer manufacturing or processing, e.g., masking, etching and others.

CVD or MOCVD films can be deposited to a desired thickness. For example, films formed can be less than 1 micron thick, preferably less than 500 nanometer and more preferably less than 200 nanometer thick. Films that are less than 50 nanometer thick, for instance, films that have a thickness between about 20 and about 30 nanometer, also can be produced.

Asymmetric metallocene compounds described above also can be employed in the process of the invention to form films by atomic layer deposition (ALD) or atomic layer nucleation (ALN) techniques, during which a substrate is exposed to alternate pulses of precursor, oxidizer and inert gas streams. Sequential layer deposition techniques are described, for example, in U.S. Pat. No. 6,287,965, issued on Sep. 11, 2001 to Kang, et al. and in U.S. Pat. No. 6,342,277, issued on Jan. 29, 2002 to Sherman. The teachings of both patents are incorporated herein by reference in their entirety.

For example, in one ALD cycle, a substrate is exposed, in step-wise manner, to: a) an inert gas; b) inert gas carrying precursor vapor; c) inert gas; and d) oxidizer, alone or together with inert gas. In general, each step can be as short as the equipment will permit (e.g. millimeters) and as long as the process requires (e.g., several seconds or minutes). The duration of one cycle can be as short as milliseconds and as long as minutes. The cycle is repeated over a period that can range from a few minutes to hours. Film produced can be a few nanometers thin or thicker, e.g., 1 millimeter (mm).

The process of the invention also can be conducted using supercritical fluids. Examples of film deposition methods that use supercritical fluid that are currently known in the art include chemical fluid deposition (CFD); supercritical fluid transport-chemical deposition (SFT-CD); supercritical fluid chemical deposition (SFCD); and supercritical immersion deposition (SFID).

CFD processes, for example, are well suited for producing high purity films and for covering complex surfaces and filling of high-aspect-ratio features. CFD is described, for instance, in U.S. Pat. No. 5,789,027, issued to Watkins, et al., on Aug. 4, 1998. The use of supercritical fluids to form films also is described in U.S. Pat. No. 6,541,278 B2, issued on Apr. 1, 2003 to Morita, et al. The teachings of these two patents are incorporated herein by reference in their entirety.

In one embodiment of the invention, a heated patterned substrate is exposed to one or more precursors, such as one or more precursors shown in Table 1, e.g., 1-methyl,1'-ethylruthenocene, in the presence of a solvent, such as a near critical or supercritical fluid, e.g., near critical or supercritical $CO_2$. In the case of $CO_2$, the solvent fluid is provided at a pressure above about 1000 psig and a temperature of at least about 30° C.

The precursor is decomposed to form a Group 8 (VIII) metal film on the substrate. The reaction also generates organic material from the Cp and Cp' moieties in the precursor. The organic material is solubilized by the solvent fluid and easily removed away from the substrate. Metal oxide films also can be formed, for example by using an oxidizing gas.

In one example, the deposition process is conducted in a reaction chamber that houses one or more substrates. The substrates are heated to the desired temperature by heating the entire chamber, for instance, by means of a furnace. Vapor of the metallocene compound can be produced, for example, by applying a vacuum to the chamber. For low boiling compounds, the chamber can be hot enough to cause vaporization of the compound. As the vapor contacts the heated substrate surface, it decomposes and forms a metal or metal oxide film. As described above a metallocene or metallocene-like precursor can be used alone or in combination with one or more components, such as, for example, other organometallic precursors, inert carrier gases or reactive gases.

Figure 8:
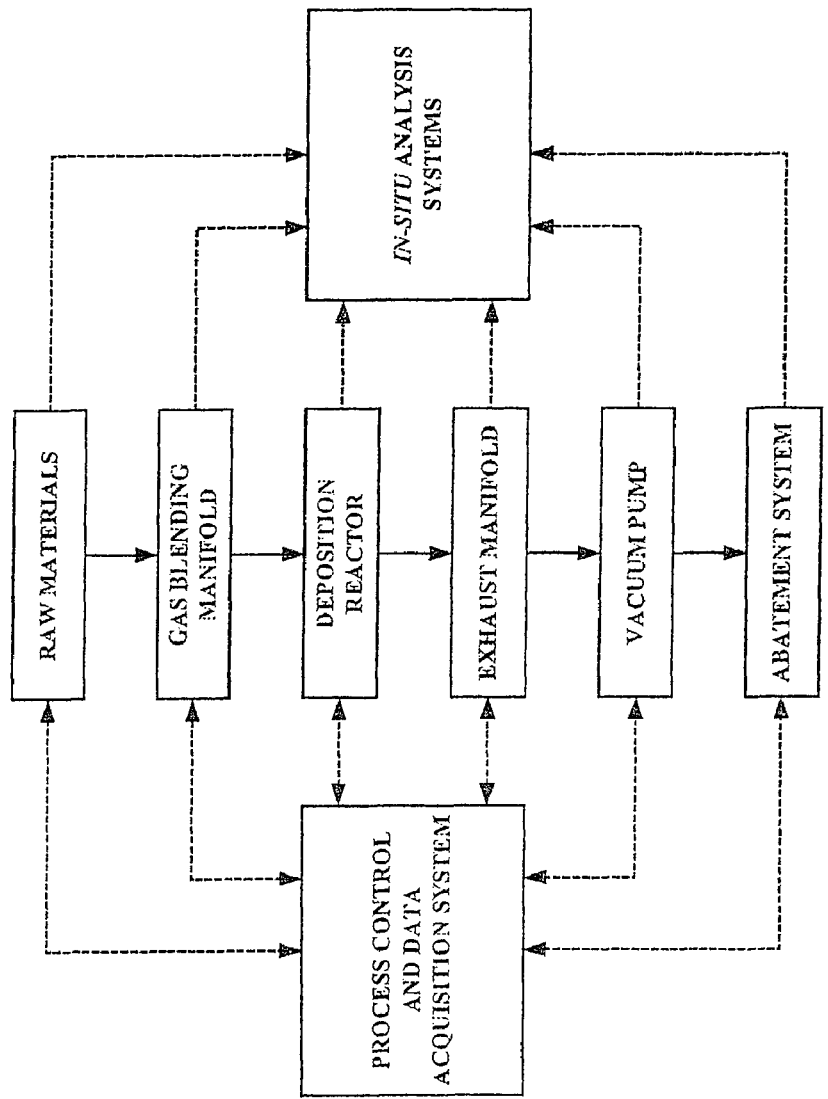
FIG. 8 is a schematic diagram that depicts a thin film deposition system that can be employed to conduct one embodiment of the process of the invention.

A schematic diagram of a system that can be used in producing films by the process of the invention is shown in FIG. 8. As shown in FIG. 8, raw materials are directed to a gas-blending manifold to produce process gas that is supplied to a deposition reactor, where film growth is conducted. Raw materials include, but are not limited to, carrier gases, reactive gases, purge gases, precursor, etch/clean gases, and others. Precise control of the process gas composition is accomplished using mass-flow controllers (MFCs), valves, pressure transducers, and other means, as known in the art.

Also shown in FIG. 8 is an exhaust manifold that conveys gas exiting the deposition reactor, as well as a bypass stream, to a vacuum pump. An abatement system, downstream of the vacuum pump, is used to remove any hazardous materials from the exhaust gas.

The deposition system is equipped with in-situ analysis system, including a residual gas analyzer, which permits measurement of the process gas composition. A control and data acquisition system monitors the various process parameters (e.g., temperature, pressure, flow rate, etc.).

Figure 9:
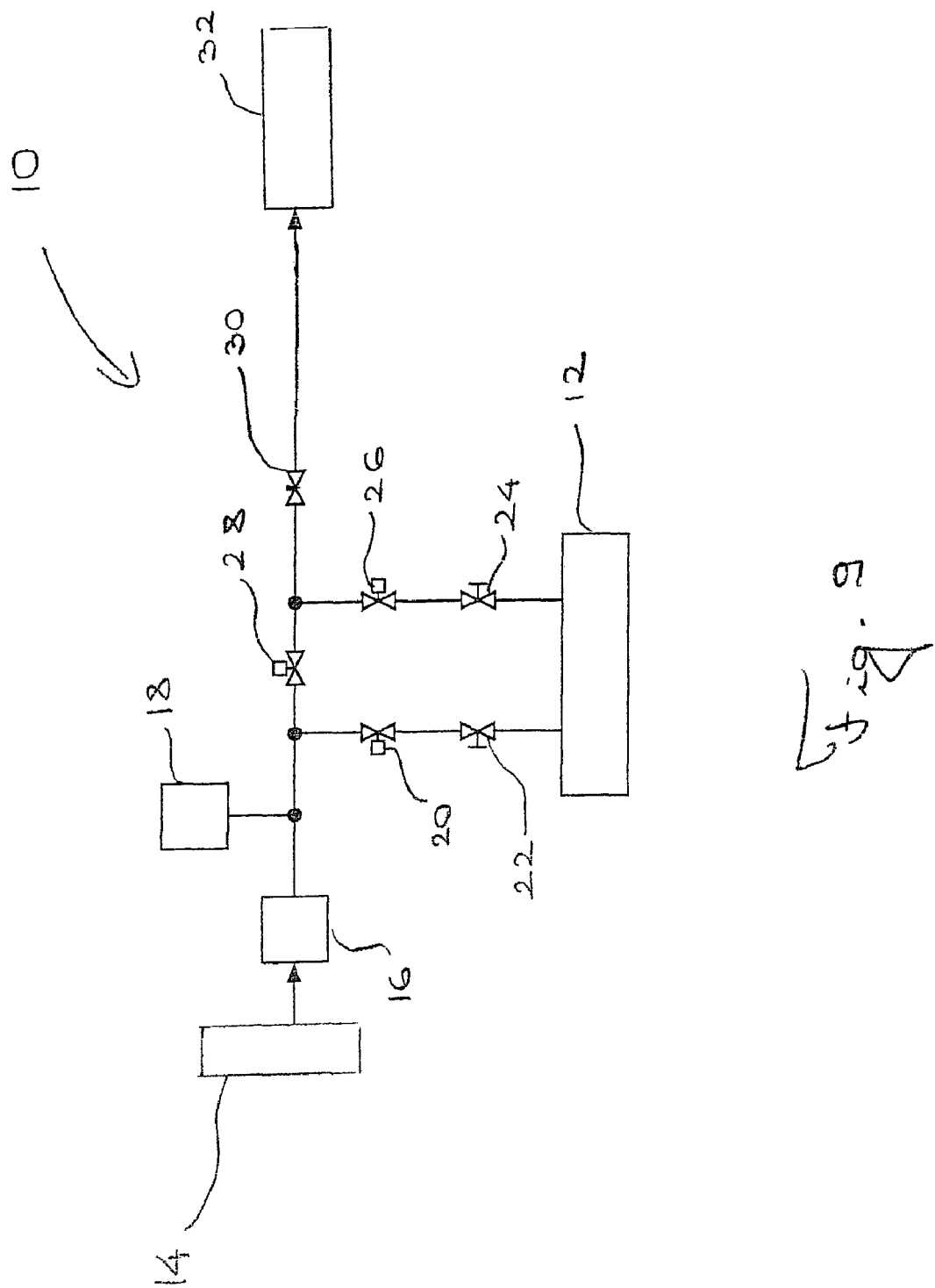
FIG. 9 is a schematic diagram of an apparatus that can be employed to vaporize liquid or solid precursors, in a gas blending manifold for the chemical vapor deposition of a film.

Shown in FIG. 9 is a schematic diagram of apparatus 10 that is an example of a suitable apparatus that can be employed to prepare process gas for film deposition by the method of the invention. Apparatus 10 includes vaporizer 12, where a liquid or solid precursor is vaporized by means known in the art. The temperature of the precursor, which determines its vapor pressure, is monitored by a thermocouple, and is controlled by resistive heaters. A suitable mathematical equation that can be used to correlate the vapor pressure of the compound to the temperature is:

$$\ln P_{sat} = A - B/T$$

where $\ln P_{sat}$ is the natural logarithm of the saturated vapor pressure, A and B are experimentally or theoretically derived constants and T is the absolute temperature (Kelvin).

A carrier gas, such as nitrogen, is supplied to vaporizer 12 from a gas source 14, e.g., a gas tank. The desired flow rate of the carrier gas is controlled by MFC 16. Pressure of the carrier gas is measured by pressure gauge 18. Valves 20 and 22 are employed to control the flow of the gas supplied to vaporizer 12. Valves 24 and 26 are employed to control the flow of the vaporized precursor and carrier gas that exit the vaporizer. Closing by-pass valve 28 directs carrier gas to vaporizer 12. Needle valve 30, located downstream of vaporizer 12, is used to control the total pressure inside the vaporizer and flow of process gas supplied to deposition reactor 32.

Assuming the gas exiting the vaporizer is fully saturated (i.e. partial pressure equals the vapor pressure), the flow rate of the precursor can be determined using the carrier gas flow rate, total pressure, and precursor vapor pressure.

Figure 10:
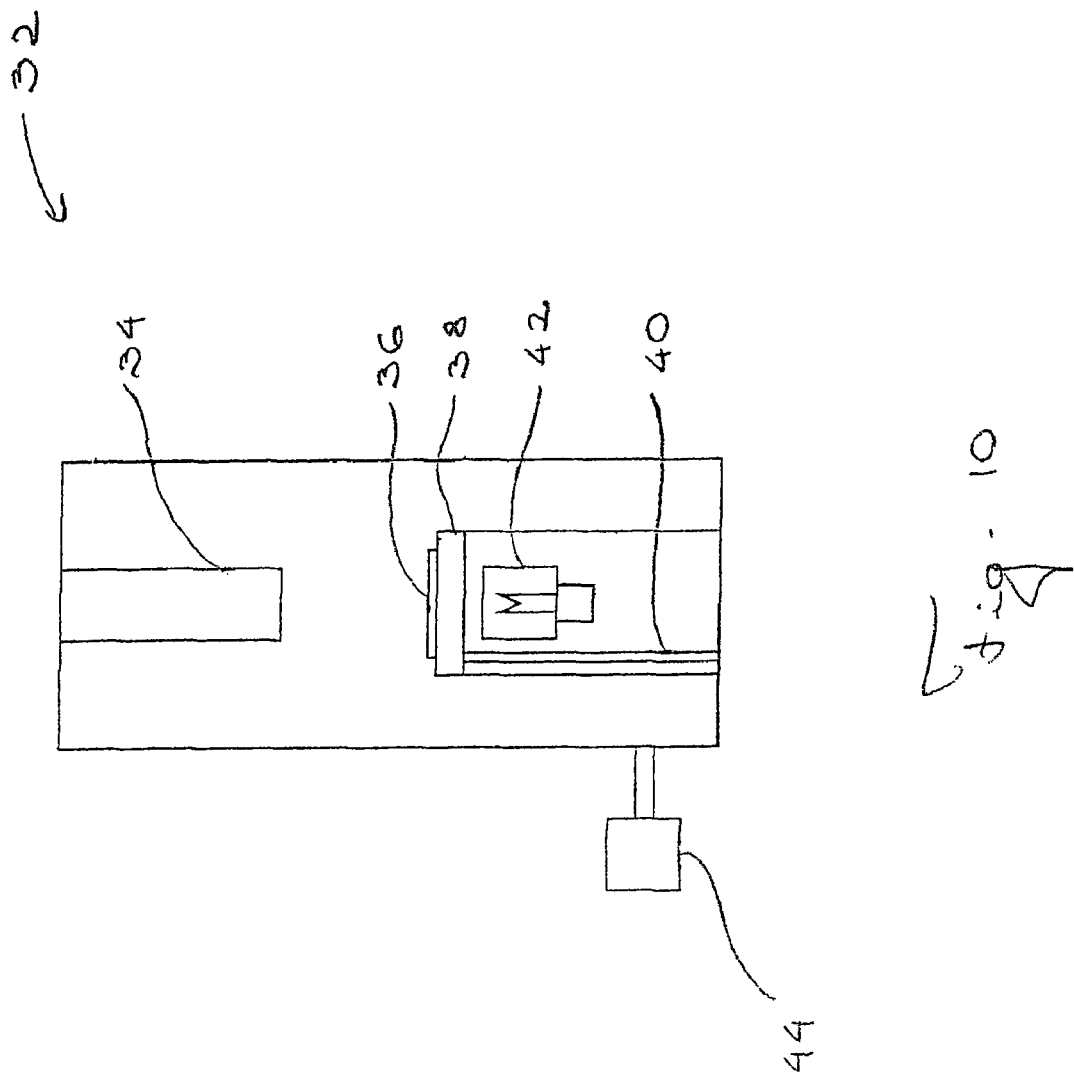
FIG. 10 is a schematic diagram of a thin film deposition reactor that can be employed to conduct an embodiment of the invention.

FIG. 10 is a schematic diagram of deposition reactor 32. The process gas that includes carrier gas and vapor phase precursor is introduced via inlet 34. Multiple inlets or apertures also can be employed for separate injection of process gases, vapors or supercritical fluids.

Film is deposited on substrate 36. A fixed gap spacing is maintained between the bottom of inlet 34 and the top of substrate 36. Substrate 36 is supported by a molybdenum susceptor 38. Susceptor 38 is a disk, capable of holding samples, e.g., having a diameter of up to 3". The reactor can be modified to deposit films over larger substrates, for example, on 200 or 300 millimeter (mm) wafers.

Susceptor temperature is measured using a thermocouple 40, and controlled by a tungsten-halogen lamp 42. Deposition reactor pressure is monitored using a capacitance manometer 44. During film deposition, substrate 36 is heated to the desired temperature, and brought into contact with the process gas. A vacuum pump is used to reduce the pressure within the deposition reactor.

In other examples, the reaction chamber is provided with in situ analysis and/or automatic process control and data acquisition. Isothermal control of process lines and chamber walls also can be provided.

Generally, the pressure in deposition reactor 32 is in the range of from about 0.01 Torr to 760 Torr, preferably in the range of from about 0.1 Torr to about 760 Torr and most preferably in the range of from about 1 Torr to about 50 Torr.

Generally, film deposition is conducted at a temperature in the range of from about 75° C. to about 700° C., preferably in the range of from about 250° C. to 450° C. temperature As known in the art, the presence of an oxidizing gas, such as, for example, air, oxygen, oxygen-enriched air, ozone ($O_3$), nitrous oxide ($N_2O$) or a vapor of an oxidizing organic compound, favors the formation of a metal oxide film. Other techniques that favor forming a metal oxide film also can be employed, as known in the art. The oxidizer partial pressure generally is in the range of from about 0 to about 50 Torr. The molar ratio of oxidizer to precursor can be in the range of from 0 to 10,000.

The precursors described above can be employed to produce films that include a single metal, e.g, an Os-film, or a film that includes a single metal oxide, e.g., $RuO_2$. Mixed films also can be deposited, for instance mixed metal oxide films. Such films are produced, for example, by employing several organometallic precursors, at least one of which being selected from the metallocene or metallocene-like compounds described above.

Metal films also can be formed, for example, by using no carrier gas, vapor or other sources of oxygen.

Films formed by the methods described herein can be characterized by techniques known in the art, for instance, by X-ray diffraction (XRD), Auger spectroscopy, X-ray photoelectron emission spectroscopy (XPS), atomic force microscopy (AFM), scanning electron microscopy, and other techniques known in the art. Resistivity and thermal stability of the films also can be measured, by methods known in the art.

EXEMPLIFICATION

Example 1

Step A

A 5 L five-necked round bottomed flask was equipped with a mechanical stirring paddle through the central neck. It was then charged with ethanol (2.0 L) and PPh3 (420 g, 1.6 mol). Two 500 mL three necked flasks, were connected to two necks of the 5 L four-necked flask via Teflon® (perfluorinated polymer, DuPont Corp.) tubing through positive displacement pumps. The remaining neck of the 5 L flask was equipped with a condenser. A heating mantle was placed beneath the 5 L flask and the solution was stirred and heated to reflux. At reflux all of the triphenylphosphine dissolved in the ethanol. The system was purged with nitrogen for 30 minutes while at reflux.

While this was taking place one of the 500 mL round-bottomed flasks was charged with $RuCl_3.XH_2O$ (100 g, 0.40 mol), ethanol (300 mL) and a Teflon® (perfluorinated polymer, DuPont Corp.) coated magnetic stirring bar. The ethanolic solution immediately developed a brown/orange colour. To dissolve all of the $RuCl_3.XH_2O$ it was necessary to heat the solution. This solution was sparged with nitrogen for 30 minutes by inserting a needle connected to a 1-2 pounds per square inch gauge (psig) nitrogen source through the septum and into the solution and by piercing the septum with another needle to allow for relief of excess pressure.

An acetonitrile/dry ice bath was made up and the other 500 mL flask was immersed into this bath. Freshly distilled methylcyclopentadiene (190 g, 270 mL, 2.4 mol, freshly distilled under a nitrogen atmosphere) was then cannulated into the cooled flask.

After the nitrogen sparging of the ethanolic solutions of triphenylphosphine and ruthenium trichloride had completed, the contents of the two 500 mL flasks were pumped into the 5.0 L flask by positive displacement pumps at independent rates so that both additions completed after 5 minutes. To accomplish this the ethylcyclopentadiene was pumped in at a rate of 45 mL/min and the ethanolic ruthenium trichloride was pumped in at a rate of 50 mL/min.

After the addition had been completed the solution was left to reflux for an additional 2 hours. During this time small orange crystals could be seen accumulating above the meniscus of the solution on the walls of the 2 L flask.

Step B

The two positive displacement pumps and Teflon® (perfluorinated polymer, DuPont Corp.) lines were disconnected from the 5 L flask after the 2 hours of stirring. A distillation sidearm was connected to one of the necks of the flask and approximately 1 L of ethanol was removed via distillation. Mechanical stirring was discontinued and the orange crystals settled to the bottom of the flask. The solution cooled to room temperature over 3 hours. The solution was then removed from the flask by inserting a piece of glass tubing with a coarse frit attached to the end of it and using reduced pressure to draw the solution through the frit and out of the flask. The crystals were washed with heptane (300 mL) and the heptane was removed in a similar fashion. The washing was carried out three times.

Step C

All of the open ports to the flask were sealed with rubber septa and the flask was evacuated and refilled with nitrogen three times. THF (500 mL, anhydrous) was cannulated into the flask and mechanical stirring was initiated. A THF solution of lithium ethylcyclopentadiene (500 mL, 1.2 M, 0.60 mol) was then cannnulated into the 5 L flask. The contents were heated to reflux and stirred for 4 hours.

After the 4 hours of reflux, stirring was discontinued and the solution was transferred to a 2 L one necked round bottomed flask. This solution was concentrated to a volume of approximately 200 mL on a rotary evaporator. The viscous liquid was then transferred to a 250 mL round bottomed flask.

The 250 mL round-bottomed flask was fitted with a short path distillation adapter with vigreux indentations and a 100 mL storage flask receptacle. The liquid was distilled under vacuum and a clear yellow liquid, 1-methyl, 1'-ethylruthenocene containing some triphenylphosphine (determined by GCMS). Spinning band distillation of the yellow liquid afforded 84.6 g (82% yield) of triphenylphosphine free 1-methyl, 1'-ethylruthenocene in >99% purity (GCMS, 1H NMR), with the remaining impurities being attributable to 1,1'-dimethylruthenocene and 1,1'-diethylruthenocene. TGA studies showed that this liquid had less than 0.01% nonvolatile residue.

Example 2

A 2 L three-necked round bottomed flask was charged with a Teflon® (perfluorinated polymer, DuPont Corp.) stirring bar, ethanol (1.0 L) and $PPh_3$ (263 g, 1.0 mol, 5 eq). A 250 mL dropping funnel, a 150 mL bath-jacketed dropping funnel, and a condenser were attached to the three necks of the 2 L flask. It is important to note that both dropping funnels were equipped with Teflon® valves that permitted their isolation from the atmosphere of the round-bottomed flask. A rubber septum was connected to the top of the 150 mL bath-jacketed dropping funnel. The top of the condenser was fitted with an T junction adapter and connected to an inert atmosphere. A heating mantle was placed beneath the 2 L three-necked round-bottomed flask and the solution was stirred and heated to reflux. At reflux all of the triphenylphosphine dissolved in the ethanol. The system was purged with nitrogen for 3 hours while at reflux.

While this was taking place a 500 mL erlenmyer flask was charged with $RuCl_3 \cdot XH_2O$ (50 g, 0.20 mol), ethanol (150 mL, 1 eq) and a Teflon® (perfluorinated polymer, DuPont Corp.) coated magnetic stirring bar. The ethanolic solution immediately developed a brown/orange colour. To dissolve all of the $RuCl_3 \cdot XH_2O$ it was necessary to gently heat the solution. This solution was poured into the 250 mL dropping funnel and the dropping funnel was fitted with a rubber septum. This solution was sparged with nitrogen for 30 minutes by inserting a needle connected to a 1-2 psig nitrogen source through the septum and into the solution and by piercing the septum with another needle to allow for relief of excess pressure.

A methanol/dry ice bath was made up in the 150 mL bath-jacketed dropping funnel. The interior of this dropping funnel was purged with nitrogen for 30 minutes in a similar fashion to which the other dropping funnel was sparged. Methylcyclopentadiene (96.2 g, 1.2 mol, 6 eq, doubly dis-tilled under a nitrogen atmosphere) was then cannulated into the cooled dropping funnel through the rubber septum.

After the 3 hours of purging the 2 L-round bottomed flask had elapsed, the Teflon® valves isolating the dropping funnels from the rest of the system were both opened and dropwise addition of the two solutions commenced simultaneously. Over the course of 20 minutes the two solutions were both added to the ethanolic $PPh_3$ solution. During this entire time the solution was at reflux. The solution quickly developed a deep orange brown color. After the addition had been completed the solution was left to reflux for an additional 2 hours. During this time small orange crystals of $CpRu(PPh_3)_2$Cl could be seen accumulating above the meniscus of the solution on the walls of the 2 L flask.

A piece of tubing with a coarse porous frit attached to one end was attached to a positive displacement pump. The fritted end of the tubing was immersed in the reactor and all of the liquids were pumped out of the 2 L round-bottomed flask. At this stage the dropping funnels were removed from the reactor. One side was fitted with a K-Head distillation adapter and the other side was fitted with a rubber septum. The flask was evacuated and refilled with nitrogen three times. Working under nitrogen, anhydrous toluene (1.0 L) was cannulated into the 5 L flask through the rubber septum. The dark opaque solution was heated to reflux and the K-head distillation adapter was opened to distill off a fraction of the solvent. Distillate was collected until the head temperature reached 109° C. (It is important to note that in different experiments this consumes different volumes of solvent—typically 400-600 mL of liquid). The solution was then cooled to below reflux.

The flask was then charged with additional toluene to obtain a volume of approximately 600 mL toluene. A lithium ethylcyclopentadienide slurry of toluene (35 g, 0.35 mol, 400 mL) was then cannulated into the reaction pot. Following this addition the solution was stirred for 4 hours at 80° C. At this stage the flask was removed from the glovebox and the majority of toluene was removed using a K-head distillation adapter.

The remaining liquid (approximately 400 mL) was decanted into a 1.0 L round-bottomed flask. This round-bottomed flask was fitted with a short path distillation adapter with vigreux indentations and distilled. The liquid collected from the vigreux column was distilled again using spinning band distillation under vacuum and 44 g of a clear yellow liquid, 1-methyl,1'-ethylruthenocene was obtained in >99% purity (GCMS). TGA studies showed that this liquid had less than 0.01% nonvolatile residue.

Example 3

Lithium(ethylcyclopentadienide) was produced as follows. A 2 L three-necked jacketed round bottomed flask was charged with a Teflon® (perfluorinated polymer, DuPont Corp.) stirring bar. A stopcock adapter, a thermowell adapter with thermowell and a rubber septum were fitted to the three necks of the flask. A nitrogen/vacuum manifold was connected to the stopcock adapater and the flask was evacuated and refilled with nitrogen 3 times. Anhydrous toluene (1.0 L) was then cannulated into the flask through the rubber septum and stirring was initiated. A cold fluid circulator was connected to the outer jacket of the jacketed flask with nalgene tubing and a cold fluid (−15° C.) was circulated through the outside wall of the jacketed flask. Once the toluene reached −10° C., freshly distilled ethylcyclopentadiene (middle cut distilled on a vigreux column) was cannulated into the flask (127 g, 1.35 mol). While stirring, n-butyllithium (800 mL, 1.6

M in hexanes, 1.28 mol) was slowly cannulated at a rate that kept the temperature below 0° C. (approximately 2 hours). During the addition of the n-butyllithium a fine white precipitate (lithium ethylcyclopentadienide) became evident in the solution.

This material could be used as a suspension or isolated as a solid via filtration and removal of solvent.

Example 4

In a nitrogen glovebox, a 250 mL flask was charged with THF (50 mL, anhydrous, inhibitor free), chloro(ethylcyclopentadienyl)bis(triphenylphosphine)ruthenium(II) (3.22 g, 0.004 mol, 1 equivalent) and a Teflon® (perfluorinated polymer, DuPont Corp.) stirring bar. The solution was stirred and a burgundy colored THF solution of sodium isopropylcyclopentadienide was slowly added (0.20 M, 30 mL, 1.5 equivalents). Following the addition the solution developed a deep red color. Within 30 minutes, the meniscus appeared yellow in color. The solution was stirred overnight.

An aliquot (1.0 mL) was taken from the solution and was analyzed by GC/MS. A peak with a mass of 301 g/mol was observed consistent with the 1-ethyl-1'-isopropylruthenocene. Other peaks with masses consistent with the presence of alkylcyclopentadiene dimers, 1,1'-diethylruthenocene, 1,1'-diisopropylruthenocene and triphenylphosphine were also observed.

The THF solvent was then removed from the flask under reduced pressure. The 250 mL flask was fitted with a vacuum jacketed short path distillation adapter and the contents of the flask were distilled under reduced pressure (~0.1 torr). A pale yellow liquid was collected (0.72 g). This liquid was then purified via chromatography. A silica gel in pentane solution was used. The column had a diameter of 0.75" and a 6" length. 0.53 g of 99+% pure 1-ethyl-1'-isopropylruthenocene were isolated via chromatography (41% yield).

Example 5

In a nitrogen glovebox, a 250 mL flask was charged with THF (50 mL, anhydrous, inhibitor free), chloro(methylcyclopentadienyl)bis(triphenylphosphine)ruthenium(II) (5.02 g, 0.007 mol, 1 equivalent) and a Teflon® (perfluorinated polymer, DuPont Corp.) stirring bar. The solution was stirred and a burgundy colored THF solution of sodium isopropylcyclopentadienide was slowly added (0.20 M, 50 mL, 1.5 equivalents). Following the addition the solution developed a deep red color. Within 30 minutes, the meniscus appeared yellow in color. The solution was stirred overnight.

An aliquot (1.0 mL) was taken from the solution and was analyzed by GC/MS. A peak with a mass of 287 g/mol was observed consistent with 1-methyl-1'-isopropylruthenocene. Other peaks with masses consistent with the presence of alkylcyclopentadiene dimers, 1,1'-dimethylruthenocene, 1,1'-diisopropylruthenocene and triphenylphosphine were also observed.

The THF solvent was then removed from the flask under reduced pressure. The 250 mL flask was fitted with a vacuum jacketed short path distillation adapter and the contents of the flask were distilled under reduced pressure (~0.1 torr). A pale yellow liquid was collected (1.78 g). This liquid was then purified via chromatography. A silica gel in pentane solution was used. The column had a diameter of 0.75" and a 6" length. 1.03 g of 98+% pure 1-methyl-1'-isopropylruthenocene were obtained after chromatography (53% yield).

Example 6

In a nitrogen glovebox, a 250 mL flask was charged with bis(propylcyclopentadienyl)magnesium (5.15 g, 0.02 mol, 1 equivalent), chloro(methylcyclopentadienyl)bis(triphenylphosphine)ruthenium(II) (5.02 g, 0.007 mol, 1 equivalent) and a Teflon® (perfluorinated polymer, DuPont Corp.) stirring bar. Toluene (120 mL, anhydrous, inhibitor free) was cannulated into the 250 mL round-bottomed flask and the contents were stirred. Following the addition of solvent the solution developed a deep red color.

The toluene solvent was then removed from the flask under reduced pressure. The toluene solvent was removed under reduced pressure and the flask was fitted with a short path distillation adapter. The distillate was collected and the GC/MS revealed that the main cut from the short path distillation was 88.7% pure 1-propyl-1'-ethylruthenocene.

Example 7

The vapor pressure of ruthenium precursors was measured. The vapor pressure of (MeCp)(EtCp)Ru was at least twice that of (EtCp)$_2$Ru, within the temperature range studied (25-70° C.).

Using a glove box with an inert atmosphere, approximately 1 g of (MeCp)(EtCp)Ru was placed within the vaporizer. Prior to deposition, the substrates were ultrasonically cleaned, at room temperature.

The substrates were rinsed for 1 minute intervals, first with $H_2O$, followed by a solution of 1:1:5-$NH_4OH$:$H_2O_2$:$H_2O$, then finally by $H_2O$. The substrates were then dried using nitrogen. Sample introduction and removal from the reactor was accomplished using a load-lock, equipped with a magnetically coupled transfer arm.

Once the substrates were loaded, and positioned above the heater, deposition of the films proceeded by the following sequence. First, the substrates were heated to the desired temperature. The samples were then exposed to the process gas, containing the precursor(s) and any co-reactants (e.g. oxidizing agents). Ultra high purity (UHP), greater than 99.999%, nitrogen was used as the carrier and purge gas. UHP oxygen was used as the oxidizing gas. The precursor, (methylcyclopentadienyl)-(ethylcyclopentadienyl) ruthenium, was vaporized using UHP nitrogen.

Example 8

Ruthenium films were deposited on silicon oxide ($SiO_2$)/silicon (Si) substrates, employing an apparatus such as shown in FIGS. 9 and 10. A summary of the reaction conditions and results is given in Table 2. During all of these experiments, the total flow rate of gas was fixed at 750 standard cubic centimeter per minute (sccm), and the precursor flow rate was 0.4 sccm. The temperature of the substrate was measured by a dual-wavelength pyrometer manufactured by Williamson Co., of Concord, Mass. The pressure in the reactor was measured using a heated Baratron capacitance monometer capable of measuring 0.1 to 1000 Torr and manufactured by MKS Instruments, of Andover, Mass. Gap refers to the distance, in inches, between process gas inlet tube and substrate being coated. The flow rate of oxygen was adjusted, according to the ratios in Table 2, and the balance of gas was nitrogen. Ratio of $O_2$ to precursor was the molar flow rate of oxygen divided by the molar flowrate of precursor in the process gas. As seen in Table 2, the time during which the substrate was exposed to the complete process gas mixture (vapors, $O_2$ reactant gas, $N_2$ carrier gas) varied between 15 and 60 minutes.

TABLE 2

| Run | Deposition Time, min | T, °C. | P, Torr | Gap, inches | Ratio of O2/precursor | Purpose | Comments |
|---|---|---|---|---|---|---|---|
| (a) | 30 | 240 | 30 | 1 | 50 | Deposit film | First attempt, no visible deposition |
| (b) | 60 | 360 | 2 | 1 | 500 | Deposit film | First successful deposition |
| (c) | 15 | 360 | 2 | 2 | 500 | Increase uniformity by increasing gap | Pyrometer output oscillated, indicated film growth |
| (d) | 15 | 360 | 2 | 2 | 50 | Increase uniformity by decreasing O2/precursor ratio to about 50 | Better uniformity than run (b) |
| (e) | 15 | 280 | 20 | 2 | 50 | Grow Ru film at lower temperature and higher pressure | No visible deposition |
| (f) | 15 | 360 | 2 | 2 | 50 | Repeat (d) to see if precursor was gone during run (e) | Similar to (d), yet slightly thinner (precursor was close to, or fully depleted) |

Figure 11:
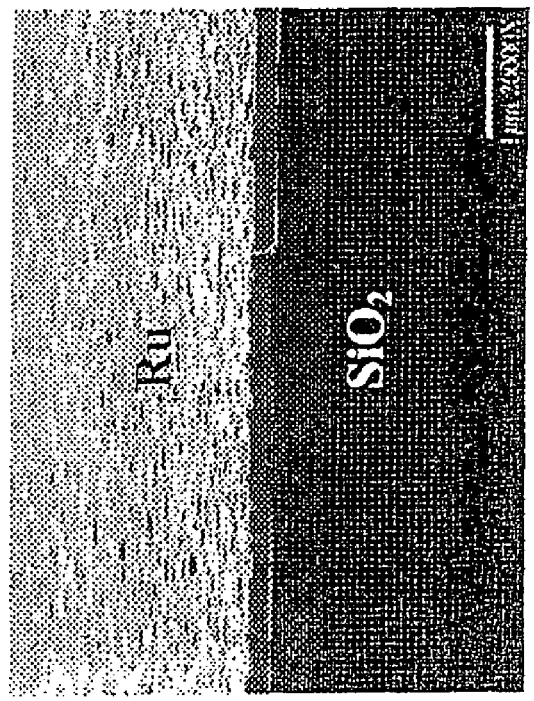
FIGS. 11 and 12 are scanning electron micrographs showing cross-sectional images of a ruthenium film produced by the process of the invention.
Figure 12:
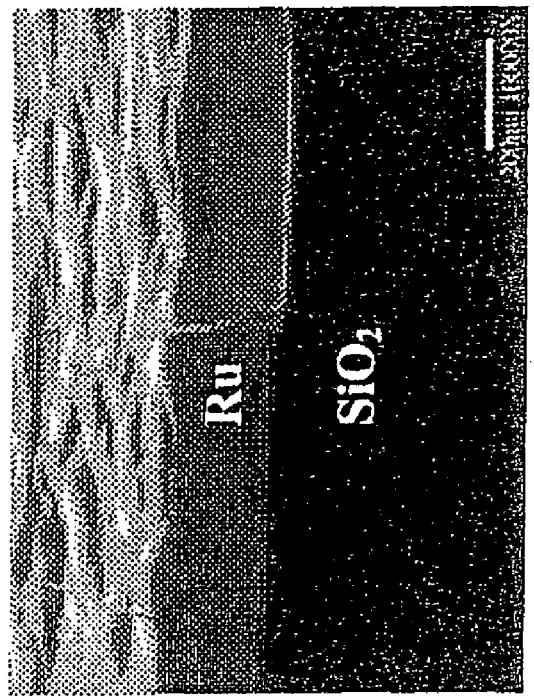
Figure 13:
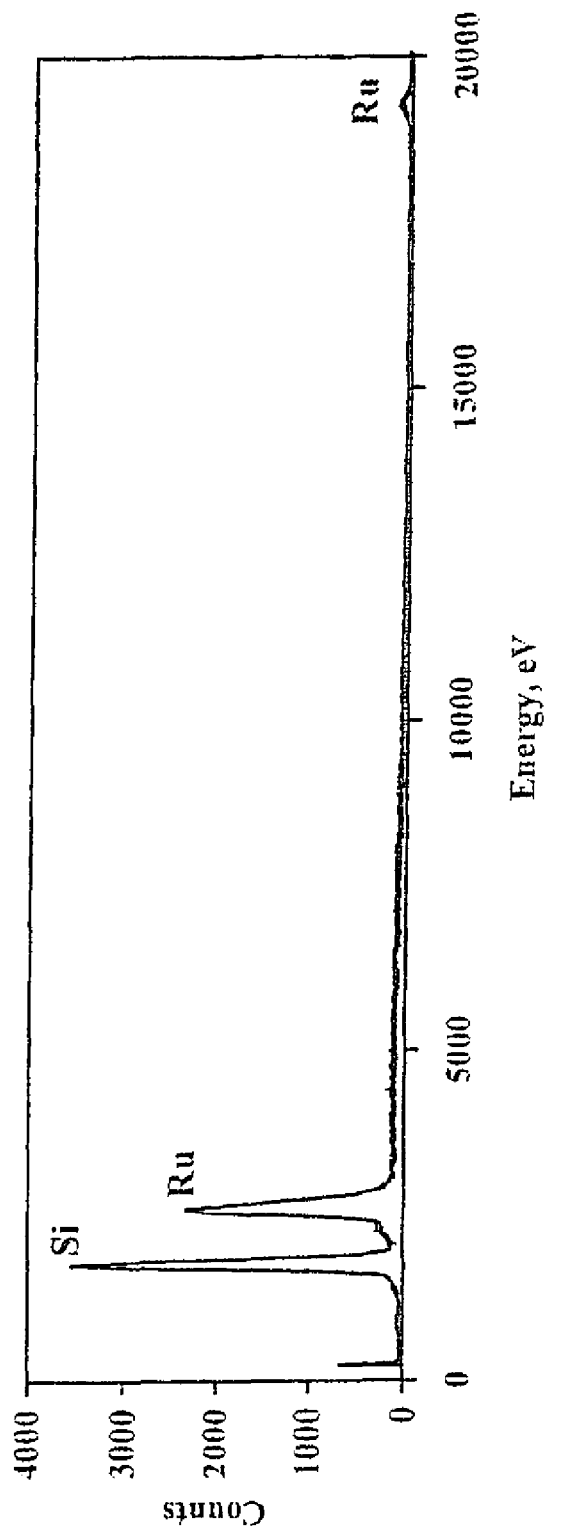
FIG. 13 is an energy dispersive spectrum of a ruthenium film produced on a $SiO_2$/Si substrate employing the process of the invention.

The thickness of the deposited films was measured by cross-sectional scanning electron microscopy (SEM). Sheet resistance, and corresponding resistivity, was measured using a 4-point probe. Elemental composition was ascertained by various techniques, including energy dispersive spectroscopy (EDS) and XPS. FIGS. 11 and 12 show cross-sectional views at 75 degrees tilt of a sample from run (d), collected by a scanning electron microscope. The film formed by the conditions of run (d) was found to have good properties with respect to thickness uniformity and resistivity. The ruthenium film was approximately 200 nanometers (nm) thick. Sheet resistance was measured to be 0.11 Ω/sq, by a 4 point probe method. This resulted in a resistivity of 22 μΩcm. A spectrum obtained by energy dispersive spectroscopy (EDS), shown in FIG. 13, confirmed the presence of a thin film of ruthenium on a $SiO_2$/Si substrate.

It is expected that thinner films, e.g., 20 to 30 nm thick, also can be produced, for example by reducing the deposition time.

Example 9

Experimental runs a-f (described in Example 8) and additional runs 1-32 are shown in Table 3. Experiments were carried out employing an apparatus such as described with reference to FIGS. 9 and 10. As seen in Table 3, substrates included $SiO_2$/Si, aluminum oxide and patterned wafers. All film deposition experiments were conducted using a nitrogen flow of 100 standard cubic centimeters per minute (sccm) through the precursor vaporizer. The gap was 2 inches for runs c-f and runs 1-32. (Runs a-b were conducted with an one inch gap.) The vaporizer pressure was 250 Torr in Runs 15 and 18 and 50 Torr in all other cases.

TABLE 3

| Run # | Precursor | Deposition Time, min | Substrate Temperature, C. | Reactor Pressure, Torr | Flow of oxygen, sccm | Vaporizer temperature, C. | Purpose | Comments |
|---|---|---|---|---|---|---|---|---|
| a | (MeCp)(EtCp)Ru | 30 | 240 | 30 | 20 | 70 | Grow Ru film | first attempt using (EtCp)(MeCp)Ru |
| b | (MeCp)(EtCp)Ru | 60 | 360 | 2 | 200 | 70 | Grow Ru film | first successful growth |
| c | (MeCp)(EtCp)Ru | 15 | 360 | 2 | 200 | 70 | Increase uniformity by increasing gap | pyrometer oscillated, indicated film growth |
| d | (MeCp)(EtCp)Ru | 15 | 360 | 2 | 20 | 70 | Increase uniformity by decreasing O2/precursor ratio to about 50 | |
| e | (MeCp)(EtCp)Ru | 15 | 280 | 20 | 20 | 70 | Grow Ru film at lower temperature and higher pressure | no visible growth |
| f | (MeCp)(EtCp)Ru | 15 | 360 | 2 | 20 | 70 | Repeat (d) to see if precursor was gone during (e) | similar to 20021028B, yet slightly thinner (precursor close to, or fully depleted) |
| 1 | (MeCp)(EtCp)Ru | 15 | 360 | 2 | 20 | 70 | Increased pressure | Looked like it grew faster than 2 Torr run |
| 2 | (MeCp)(EtCp)Ru | 15 | 350 | 2 | 20 | 70 | Duplicate (d) and (f) with new load of precursor and altered delivery tube | No visible growth |
| 3 | (EtCp)2Ru | 15 | 275 | 2 | 20 | 70 | Duplicate (1) with (EtCp)2Ru precursor | |
| 4 | (EtCp)2Ru | 15 | 350 | 2 | 10 | 70 | Duplicate (2) with a substrate temp of 350 C | |
| 5 | (MeCp)(EtCp)Ru | 15 | 350 | 2 | 10 | 70 | Duplicate (1) with half the o2 flow NOTE: PYROMETER HAS BEEN RECALIBRATED | |
| 6 | (EtCp)2Ru | 5 | 350 | 2 | 10 | 70 | Same parameters as (4) using (EtCp)2Ru | |
| 7 | (MeCp)(EtCp)Ru | 30 | 350 | 2 | 10 | 70 | Duplicate (4) with 5 min run time | |
| 8 | (MeCp)(EtCp)Ru | 5 | 350 | 20 | 10 | 70 | Run a 30 min deposition with established flow settings @ min. temp., set point on susceptor initially set to 400 C | |

TABLE 3-continued

| Run # | Precursor | Deposition Time, min | Substrate Temperature, C. | Reactor Pressure, Torr | Flow of oxygen, sccm | Vaporizer temperature, C. | Purpose | Comments |
|---|---|---|---|---|---|---|---|---|
| 9 | (MeCp)(EtCp)Ru | 5 | 350 | 20 | 10 | 70 | Effect of pressure on nucleation density and growth rate | |
| 10 | (MeCp)(EtCp)Ru | 5/5 | 350 | 2 | 0/10 | 70 | Run reactive gas (O2) off for first 5 min then on for 5 min to see if improve nucleation density | No apparent advantage |
| 11 | (MeCp)(EtCp)Ru | 180 | 348 | 2 | 10 | 70 | First try at operating an ALD program (see sheet and notebook for details) | Appeared similar to other thin Ru films |
| 12 | (MeCp)(EtCp)Ru | 12 | 303 | 20 | 10 | 70 | Effect of operation @ 20 Torr chamber pressure and lower substrate temp | |
| 13 | (MeCp)(EtCp)Ru | 5.17 | 332 | 2 | 200 | 70 | Determine nucleation density of RuO2 using parameters from (c) | |
| 14 | (MeCp)(EtCp)Ru | 5 | 361 | 2 | 10 | 70 | Substrate treated with anthraquinone by Dave Thompson same as (6) | very rough |
| 15 | (MeCp)(EtCp)Ru | 5 | 350 | 200 | 40 | 70 | Perform Ru deposition at chamber pressure 2 orders of magnitude higher than previous runs (2 Torr to 200 Torr) also increase o2 ratio as per run (13) | Film growth looks poor |
| 16 | (MeCp)(EtCp)Ru | 5 | 334 | 20 | 200 | 70 | Duplicate (13) with chamber pressure @ 20 Torr | |
| 17 | (MeCp)(EtCp)Ru | 5 | 353 | 2 | 10 | 70 | Perform Ru deposition at "ideal" temp conditions and lower carrier gas flows to reduce nozzle velocity. Chamber pressure remains 2 Torr (benchmark (6)) | |
| 18 | (MeCp)(EtCp)Ru | 2 | 354 | 20 | 10 | 70 | Duplicate (17) @ higher chamber pressure ad possibly shorter time span | Vaporizer error (250 Torr) |
| 19 | (MeCp)(EtCp)Ru | 2 | 355 | 20 | 10 | 70 | Repeat (17) @ 20 Torr chamber pressure and 2 min deposition time | |
| 20 | (MeCp)(EtCp)Ru | 3 | 302 | 20 | 200 | 70 | Thin film deposition with high O2 flow ruthenium oxide layer | |
| 21 | (MeCp)(EtCp)Ru | 5 | 304 | 2 | 200 | 70 | Duplicate (20) @ 2 Torr chamber Pressure | |
| 22 | (MeCp)(EtCp)Ru | 5 | 330 | 2 | 200 | 70 | Duplicate (13) | Good Deposition |
| 23 | (EtCp)2Ru | 5 | 331 | 2 | 200 | 70 | Duplicate (22) with (EtCp)2 Ru Precursor | Deposition looks good |
| 24 | (MeCp)(EtCp)Ru | 2 | 330 | 2 | 200 | 70 | Deposit thin Ru film on pattern wafer and other substrates (Al2O3 and SiO2) | |
| 25 | (MeCp)(EtCp)Ru | 10 | 329 | 2 | 200 | 70 | Deposit thick Ru film on pattern wafer | Good Deposition |
| 26 | (MeCp)(EtCp)Ru | 120 | 345 | 2.3 | 10 | 70 | ALD Ru Deposition on patterned wafer and other substrates | |
| 27 | (EtCp)2Ru | 5 | 333 | 2.4 | 200 | 90 | Decrease sheet resistance of (23) to watch (22) by increasing the temperature of vaporizer to 90 C | Good deposition thicker/rougher in the middle of the wafer |
| 28 | (EtCp)2Ru | 5 | 333 | 2.5 | 200 | 80 | Duplicate (27) with vaporizer at 80 C | similar to 20030311A, yet slightly thinner |
| 29 | (MeCp)(EtCp)Ru | 5 | 332 | 2.2 | 200 | 90 | Duplicate (27) with (MeCpEtCp)Ru precursor at 90 C | Thick film growth |
| 30 | (MeCp)(EtCp)Ru | 5 | 331 | 2.2 | 200 | 80 | Duplicate (29) with (MeCpEtCp)Ru precursor at 80 C | Similar to 20030312A, yet slightly thinner |
| 31 | (MeCp)(EtCp)Ru | 10 | 310 | 2.3 | 200 | 90 | Max deposition rate at lower substrate temp. | not much change |
| 32 | (MeCp)(EtCp)Ru | 10 | 290 | 2.4 | 200 | 90 | Continue to lower substrate temp. | Very nice deposition, thicker on the perimeter |

The ALD experiment in Run 11 was conducted as follows. A patterned wafer substrate was exposed to a process gas stream containing (1) nitrogen purge; (2) nitrogen and precursor; (3) nitrogen purge; and (4) nitrogen and oxygen. The total cycle time (all 4 steps) of the experiment, run 11, was 10 seconds (3 seconds for steps 1 and 3, 2 seconds for steps 2 and 4). The process cycle (all 4 steps) was repeated 1080 times, for an overall duration of 180 minutes. The resulting film thickness was approximately 65 nm.

In Run 26, ALD was conducted in a similar manner, for a total deposition time of 120 minutes. The deposited material was not coalesced, but consisted of discrete nanocrystals ranging from 50 to 300 nm in diameter.

Example 10

Properties of films deposited using 1-methyl,1'-ethylruthnocene were measured and were compared with those of films produced using 1,1'-diethylruthenocene.

Films were deposited on a 3-inch wafer using an apparatus such as described above. The wafer temperature was 330° C., the precursor vaporization temperature was 70-90° C., the chamber pressure was 2 Torr, the oxygen flow rate was 200 sccm, the nitrogen flow rate was 550 sccm, the deposition time was 5 minutes and the film growth rate was 10-60 nm/minute.

Sheet resistance was measured with four-point probe, perpendicular to major flat and 5 mm intervals (major flat=0 mm).

Figure 14:
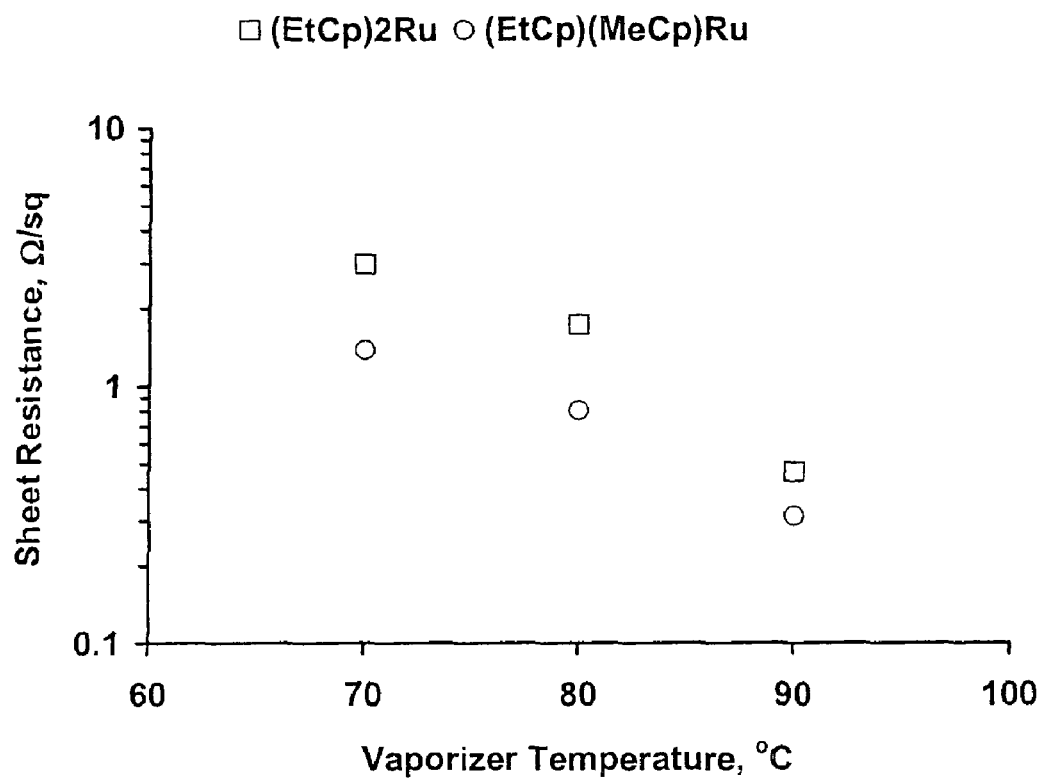
FIG. 14 is a plot of the measured sheet resistance as a function of vaporizer temperature for a film deposited using a 1-methyl,1'-ethylrutehnocene precursor and a film deposited using 1,1'-diethylruthenocene.
Figure 15:
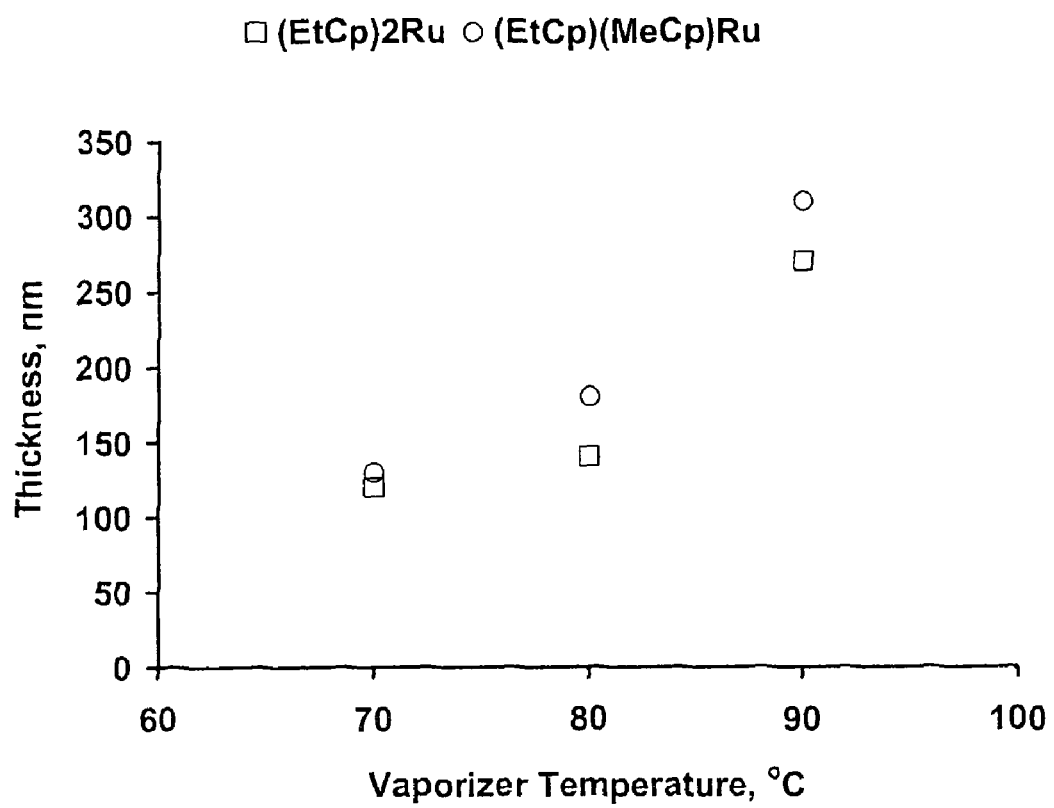
FIG. 15 is a plot of thickness of films deposited from 1-methyl,1'-ethylruthenocene precursor, in comparison with films deposited from 1,1'-diethylruthenocene, as a function of vaporizer temperature.
Figure 16:
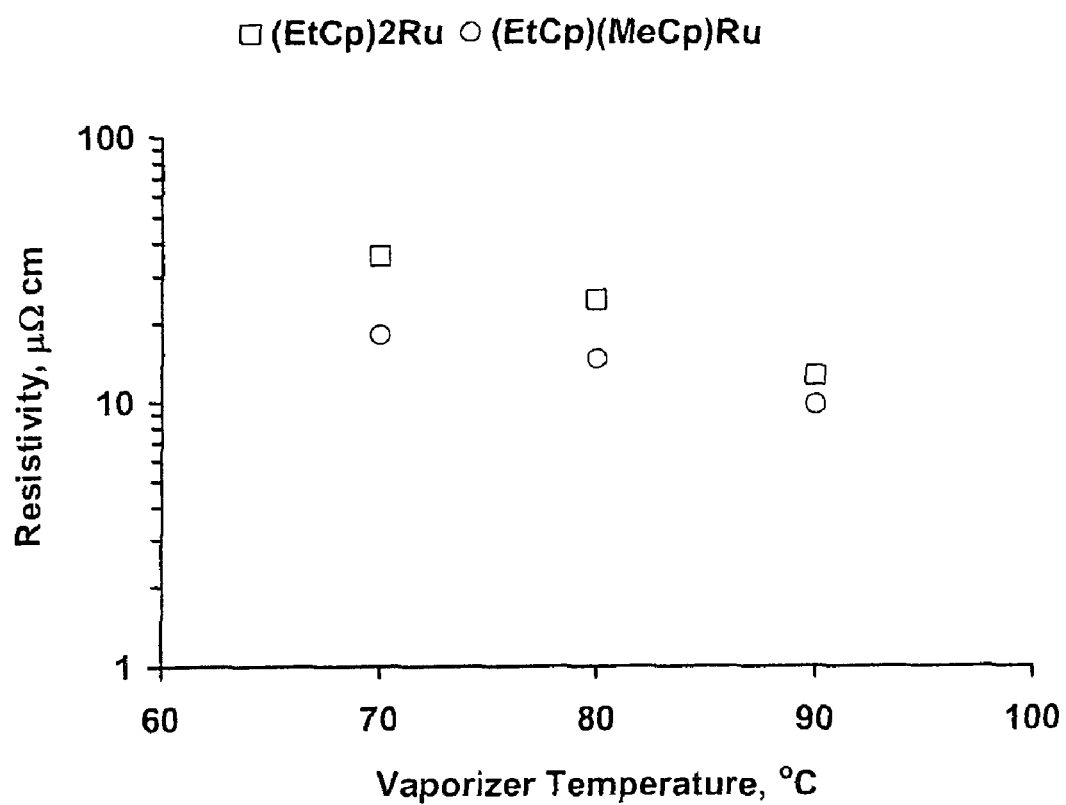
FIG. 16 is a plot of resistivity of films deposited using a 1-methyl, 1'-ethylrutehnocene precursor and 1,1'-diethylruthenocene as a function of vaporizer temperature.

The results are shown in FIGS. 14, 15 and 16.

FIG. 14 describes the measured sheet resistance of films deposited from $(EtCp)_2Ru$ and (EtCp)(MeCp)Ru, as a function of vaporizer temperature. Vaporizer temperature was varied, while all other experimental conditions (temperature, pressure, etc.) were fixed. The data was measured at the center of the substrate. This figure shows that the films deposited using (EtCp)(MeCp)Ru exhibited lower sheet resistance, compared to the films deposited from (EtCp)$_2$Ru. This can be attributed to the higher concentration of (EtCp)(MeCp)Ru in the process gas, compared to (EtCp)$_2$Ru, at the same vaporizer temperature. This difference in precursor concentration is believed to result from the difference in vapor pressure.

The wafer was cleaved and the film thickness, measured by cross-sectional SEM, is shown in FIG. 15. Under identical conditions, over the same period of time, films produced from 1-methyl,1'-ethylruthenocene were thicker than the films formed employing 1,1'-diethylruthenocene. This result also was attributed to the higher vapor pressure of 1-methyl,1'-ethylruthenocene.

The resistivity of these films, shown in FIG. 16, was calculated using the measured values of sheet resistance and thickness.

X-ray diffraction data also was obtained and indicated that crystallites observed in SEM data were composed of Ru. In addition, X-ray photoelectron spectroscopy data was gathered as a function of depth of the film. The data indicated that oxygen was present near the surface of the films and that the amount of oxygen present in the film decreased, as one goes deeper into the film. It appeared that less oxygen was present at depth in films produced using 1-methyl,1'-ethylruthenocene than in films formed from 1,1'diethylruthenocene.

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. A process for producing a film, comprising the step of decomposing at least one precursor in the presence of a substrate, wherein the decomposition is thermal, chemical, photochemical, or plasma-activated, and said precursor is 1-methyl, 1'-ethyl ruthenocene, thereby forming a film on the substrate; wherein the decomposition is conducted in the presence of a solvent fluid; and wherein the film includes ruthenium or ruthenium oxide.

2. The process of claim 1, wherein said precursor is vaporized and the vapor is directed into a deposition reactor housing the substrate.

3. The process of claim 2, wherein the deposition reactor is at a pressure in the range of from about 0.01 Torr and about 760 Torr.

4. The process of claim 3, wherein the deposition reactor is at a pressure in the range of from about 0.1 Torr and about 760 Torr.

5. The process of claim 4, wherein the deposition reactor is at a pressure in the range of from about 1 Torr and about 50 Torr.

6. The process of claim 1, wherein the substrate is at a temperature in the range of from about 75° C. to about 700° C.

7. The process of claim 6, wherein the substrate is at a temperature in the range of from about 250° C. to about 450° C.

8. The process of claim 1, wherein the substrate is comprised of a material selected from the group consisting of a metal; a metal silicide; a semiconductor; an insulator and a barrier material.

9. The process of claim 1, wherein the substrate is a patterned wafer.

10. The process of claim 1, wherein the process includes decomposing at least one additional organometallic precursor.

11. The process of claim 1, wherein vapor of said precursor is combined with a carrier gas.

12. The process of claim 1, wherein vapor of said precursor is combined with an oxidizing component.

13. The process of claim 12 wherein the oxidizing component is selected from the group consisting of oxygen, ozone and nitrous oxide.

14. The process of claim 1, wherein vapor of said precursor is combined with at least one other gas or vapor component to form a process gas.

15. The process of claim 14, wherein the process gas is supplied to a deposition reactor.

16. The process of claim 15 wherein an exhaust gas is exhausted from the deposition reactor.

17. The process of claim 1, wherein the film has a thickness that is less than about 500 nanometer.

18. The process of claim 1, wherein the film has a thickness that is less than about 200 nanometer.

19. The process of claim 1, wherein the film has a thickness that is less than 50 nanometer.

20. The process of claim 1, wherein the film has a thickness that is less than about 30 nanometer.

21. The process of claim 1, wherein the solvent fluid is a near critical or supercritical fluid.

22. The process of claim 1, wherein film is deposited on the substrate in layers.

23. The process of claim 22, wherein the film is deposited by sequential chemical vapor deposition, atomic layer nucleation or atomic layer deposition.

* * * * *